United States Patent
Vandermeulen et al.

(10) Patent No.: US 10,481,598 B2
(45) Date of Patent: Nov. 19, 2019

(54) MOTION SYSTEM WITH SENSOR OUTPUTS AND HAPTIC CONTROLS

(71) Applicant: Performance Motion Devices, Inc., Westford, MA (US)

(72) Inventors: Peter Fransiscus Vandermeulen, Newburyport, MA (US); Emanuel Gustav Lewin, Lincoln, MA (US); Thomas Keller, Westford, MA (US)

(73) Assignee: Performance Motion Devices, Inc., Westford, MA (US)

( * ) Notice: Subject to any disclaimer, the term of this patent is extended or adjusted under 35 U.S.C. 154(b) by 0 days.

(21) Appl. No.: 16/046,145

(22) Filed: Jul. 26, 2018

(65) Prior Publication Data

US 2019/0094848 A1    Mar. 28, 2019

Related U.S. Application Data

(60) Provisional application No. 62/562,011, filed on Sep. 22, 2017.

(51) Int. Cl.
*G05B 23/02* (2006.01)
*G01R 31/34* (2006.01)
*H02P 29/64* (2016.01)

(52) U.S. Cl.
CPC ......... *G05B 23/0272* (2013.01); *G01R 31/34* (2013.01); *H02P 29/64* (2016.02)

(58) Field of Classification Search
CPC ..... G01R 31/34; G05B 23/0272; H02P 29/64; H02P 2203/00; H02P 2205/01; H02P 23/14; H02P 29/60
See application file for complete search history.

(56) References Cited

U.S. PATENT DOCUMENTS

| 4,779,031 A | 10/1988 | Arends et al. |
| 4,893,068 A | 1/1990 | Evans, Jr. |
| 5,184,056 A * | 2/1993 | Brune ............... H02P 25/024 318/799 |
| 5,734,528 A | 3/1998 | Jabbari |
| 6,191,507 B1 | 2/2001 | Peltier et al. |

(Continued)

OTHER PUBLICATIONS

International Search Report and the Written Opinion for International Application No. PCT/US2018/043839, "Motion System With Sensor Outputs and Haptic Controls" dated Nov. 8, 2018 (11 pages).

(Continued)

*Primary Examiner* — Thai T Dinh
(74) *Attorney, Agent, or Firm* — Hamilton, Brook, Smith & Reynolds, P.C.

(57) ABSTRACT

A motion control system provides optimized communications within and between an amplifier and a profile generation subsystem. In particular, the communications can provide data streams between components of the motion control that are derived from observed variables of the motion system. An amplifier subsystem drives a motor and output motor data indicating status of the motor. The profile generation subsystem issues motor control commands to the amplifier subsystem and generates motor summary data based on the motor data. The profile generation subsystem selectively output an error signal based on at least one of the motor data and motor summary data.

21 Claims, 17 Drawing Sheets

(56) References Cited

U.S. PATENT DOCUMENTS

| | | | |
|---|---|---|---|
| 6,211,639 B1 | 4/2001 | Meister et al. | |
| 6,653,810 B2 | 11/2003 | Lo | |
| 6,865,441 B2 | 3/2005 | Chandhoke | |
| 6,888,469 B2 | 5/2005 | Seferian | |
| 6,943,521 B2 | 9/2005 | Kurokawa et al. | |
| 6,989,642 B2 | 1/2006 | Wakefield et al. | |
| 7,024,257 B2 | 4/2006 | Pearce et al. | |
| 7,064,513 B2 | 6/2006 | Fenley | |
| 7,157,878 B2* | 1/2007 | Collier-Hallman | B62D 5/046 318/472 |
| 7,194,321 B2 | 3/2007 | Sun et al. | |
| 7,259,470 B2 | 8/2007 | Matsuoka | |
| 7,397,363 B2 | 7/2008 | Joao | |
| 7,437,201 B2 | 10/2008 | Cullen | |
| 7,719,214 B2* | 5/2010 | Leehey | G05B 19/042 318/286 |
| 9,240,745 B2* | 1/2016 | Venkataraman | H02P 6/182 |
| 9,300,235 B2* | 3/2016 | Ng | H02P 29/00 |
| 9,331,628 B2* | 5/2016 | Takahashi | H02P 31/00 |
| 9,716,449 B2* | 7/2017 | Lumsden | H02P 6/182 |
| 9,722,515 B2* | 8/2017 | El-Ibiary | H02K 11/33 |
| 10,333,435 B2* | 6/2019 | Li | H02P 5/00 |
| 2003/0006749 A1 | 1/2003 | Rollman | |
| 2003/0080772 A1* | 5/2003 | Giacomini | B60R 16/0239 324/765.01 |
| 2005/0067996 A1* | 3/2005 | Eba | G05B 19/19 318/609 |
| 2006/0197481 A1 | 9/2006 | Hotto et al. | |
| 2008/0012522 A1* | 1/2008 | Wiegers | H02P 6/16 318/638 |
| 2008/0074075 A1 | 3/2008 | Davis et al. | |
| 2008/0084171 A1 | 4/2008 | Leehey et al. | |
| 2010/0194320 A1* | 8/2010 | Kaneko | H02P 21/06 318/400.23 |
| 2014/0265986 A1 | 9/2014 | Gebregergis et al. | |
| 2014/0352459 A1 | 12/2014 | Matsuzawa | |
| 2015/0270790 A1 | 9/2015 | Tavallaei et al. | |

OTHER PUBLICATIONS

"Magellan Motion Controllers," Performance Motion Devices, Inc., 4 pages (2004).

"The Magellan Family of Motion Processors," Performance Motion Devices, Inc., 4 pages (2005).

"Magellan Motion Processor User's Guide for MC55000 & MC58000 Series Motion Processors," Performance Motion Devices, Inc., 115 pages (2003).

"New All-Digital Motion Module Delivers Advanced Features," Press Release of Performance Motion Devices, Inc., 1 page (Aug. 1, 2005).

"PD&D Exclusive, All-Digital Motion Module," Product Design & Development, p. 7 (Sep. 2005).

Servo-Halbeck Press Release, Integrated Motion Controllers, servo-Halbeck GmbH & Co.KG, pp. 1-2, [retrieved on Sep. 11, 2006]. Retrieved from the Internet URL: HTTP:www.servo-halbeck.com/html/integrated_mcs.html.

* cited by examiner

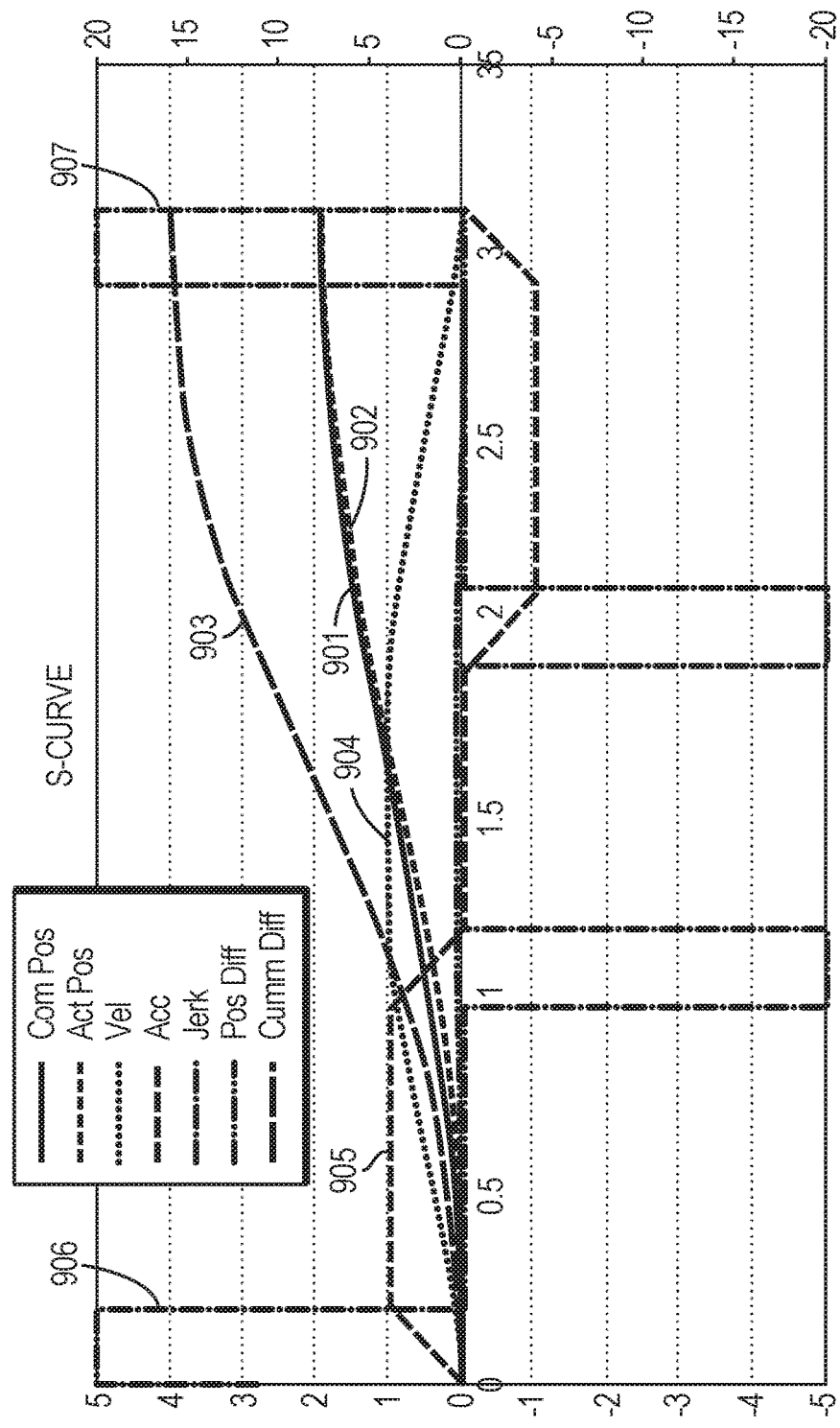

MOTION SYSTEM WITH SENSOR OUTPUTS AND HAPTIC CONTROLS

RELATED APPLICATION

This application claims the benefit of U.S. Provisional Application No. 62/562,011, filed on Sep. 22, 2017. The entire teachings of the above application are incorporated herein by reference.

BACKGROUND

In conventional embedded motion control integrated circuits (ICs) and subsystems, data from connected sensors (thermal sensors, encoder inputs, motor windings, input/output sensors and others) is generally made available to a higher level control system. Oftentimes such a higher level control system consists of a microprocessor, microcontroller, PC, single board computer and the like. Generally such higher level controllers are in turn connected over a network (be it wired or wireless) to a central data collection and storage system. Typically, data from the embedded motion control ICs and subsystems is generated at a high frequency (sometimes at less than 1 ms intervals) and because there are a lot of data points associated with the motion control ICs and subsystems, this data traffic consumes significant network and storage resources.

SUMMARY

Example embodiments provide for optimized communications within a motion control system. In particular, the communications may provide data streams between components of the motion control that are derived from observed variables of the motion system such as a position, position error, cumulative position error, velocity, velocity error, cumulative velocity error, acceleration, acceleration error, cumulative acceleration error, a current, a motor winding temperature an amplifier component temperature, a torque, a jerk, a resonant frequency, a motion completion time or any other measurable or observable or derived parameter in the motion system including combination parameters from simultaneously running multiple axis and control loops. Further, a measurement data stream may be optimized such that only motion system drift errors are reported to higher-level controllers.

In many cases, the data from sensors is relatively stable and does not change much over time. As an example, a motor temperature tends to change slowly or not at all. For those kinds of data points, it would be desirable to not report the actual data for every measurement cycle, but rather to only report if the data is drifting over time. Optionally, one may also report a mean value and deviation of the data point over a short time interval and then compare that measurement to a similar mean value and deviation of the data point taken at a later time. For example, if the motion system is in principle able to generate data points for a motor winding temperature every millisecond, one may assume that this data does not change faster than the thermal time constant of the motor (which generally is minutes, not milliseconds). In that situation, one may make a small set of measurements, say 30, for 30 milliseconds, store the calculated mean and standard deviation locally on the motion IC for those 30 points and then repeat the measurement set a minute later, collecting another 30 data points and calculating another mean and standard deviation. Only if the second mean and standard deviation have drifted in a statistically significant way would an error be raised and sent to the higher level controllers. By reducing the measurement data in this way, no information is really lost, only drift events are reported (and potentially the mean and standard deviation of the various data sets), thereby significantly reducing network traffic between the motion IC and higher level controllers as well as the need for data storage requirements at those higher level controllers. In the case where a drift even has occurred the motion IC may still start reporting motor winding temperatures at the "normal" one millisecond interval, thereby temporarily allowing for a more detailed data collection rate. An algorithm can be designed that automatically switches between reporting of summary data and reporting of detail data, based on the analysis of the data points coming in. For example, if a first set of 30 measurements and an immediate second set of 30 measurements have the same mean and standard deviation, than the time to start measuring a third set of measurements may automatically be delayed by a set amount of time.

Example embodiments include a system that provides a cost efficient, controllable and efficient method to capture a motion control data stream, process it and provide error handles while simultaneously not overloading the motion control network and higher level system database resources In motion control subsystems, there often exists a need to provide feedback feeling (i.e., haptic feedback) to an operator of the system. For example, in robotic surgery, it would be very helpful if the surgeon can "feel" how much resistance the robot is encountering. Conventionally, one may collect torque data from the robot motor through the motion control subsystem connected to the robot motor, send it up through a motion network to a second motion controller that imparts a force or vibration onto the surgeon's hand through a motor connected to a handle or fixture (e.g., the haptic motor). However, this method relies on the motion network to not have already too much data traffic and in most motion control systems, the connection between the motion control subsystem connected to the robot motor and the motion control subsystem connected to the haptic motor imparting a force or vibration to the surgeon's hand would go through a master controller, wherein it controls the motion network and the two motion subsystems connected to actual motors are slave axis on the network. This results in the need for processing of motion commands on the master controller and creates both a lot of unnecessary network traffic and computational resources on the master controller. Instead one may take the direct current measurement or position encoder information from the robot motor and simultaneously share the current between the robot motor motion subsystem and the haptic motor controller subsystem, thereby eliminating motion network data traffic and computational resources at the master controller level.

Thus, there remains a need for a system that provides an easy way to controllably connect two motion systems in order to provide a feedback signal to an operator, while at the same time not to burden a motion network with too much data traffic.

Provided herein are methods and systems used for the efficient aggregation of low level sensor data and reporting of such data to higher level controllers. In accordance with one or more embodiments, sensor data from a low level component, such as for example an amplifier, encoder, temperature sensor, or current sensor is measured a set number of times by an embedded microprocessor, DSP, ASIC, or microcontroller and a statistical mean and deviation are calculated and stored. At a later time interval, a second set of measurements is made and a second mean and standard deviation are calculated for the same signal. In example embodiments, the embedded microprocessor, DSP, or microcontroller may compare the mean and deviations from the first and second measurement sequences and if control limits for drift are exceeded, sends an error to a higher level system controller. In example embodiments, such a higher level controller contains a data storage device or mechanism. In some embodiments, the embedded microcontroller, DSP, ASIC or microprocessor may only send summary data or error drift data to the higher level controller thereby significantly reducing network traffic and data storage requirements between the embedded controller and the higher level controller. In further embodiments, the embedded microcontroller, DSP, ASIC or microprocessor calculates a running mean and standard deviation from the sensor data stream. The embedded microcontroller, DSP, ASIC or microprocessor stores summary data (mean and standard deviation) only rather than individual measurement data. In embodiments such reduced data sets are compared to reduced datasets that are subsequently measured. In embodiments the data can be any parameter associated with the motion system such as a position, position error, cumulative position error, velocity, velocity error, cumulative velocity error, acceleration, acceleration error, cumulative acceleration error, a current, a motor winding temperature an amplifier component temperature, a torque, a jerk, a resonant frequency, a motion completion time or any other measurable or observable or derived parameter in the motion system including combination parameters from simultaneously running multiple axis and control systems. A motion parameter may have an upper control limit (UCL) 401 or a lower control limit (LCL) 402 or both or additional soft warning limits.

In further embodiments, a reduced dataset from a lower level sensor in a lower level control module is used and compared to a reduced dataset generated from a sensor connected to a higher level control module and the combined resulting error is forwarded to a higher level control function for further processing and or reporting.

Provided herein are methods and systems used for the efficient feedback of motion system exerted forces to an operator. In example embodiments, a motion system consisting of two linked motion control units, where the encoder of a first motor is simultaneously used to control a first motor control system as well as a input into an auxiliary input for a second motor control system, and where the encoder for the second motor is simultaneously used to control a second motor control system as well as a input into an auxiliary input for a first motor control system. In example embodiments, the encoder feedback from a haptic device (joy stick) is fed simultaneously to the position loop input of the haptic device (joy stick) and to the aux encoder input of a main motor system. In example embodiments, the encoder feedback from a main motor system is fed simultaneously to the position loop of the main motor system and the aux encoder input of a haptic device (joy stick). In example embodiments, the current sensed in the windings of the first motor is also shared with the control system for the second motor and vice versa. In example embodiments, the first motion control unit takes the current sense signal from the main motor and adds it to the current loop of the haptic motor system. In example embodiments, the haptic motor may be a vibrating motor or a torque motor.

In an example embodiment, a motor control module includes an amplifier subsystem and a profile generation subsystem. The amplifier subsystem may be configured to drive a motor and output motor data indicating status of the motor. The profile generation subsystem may be configured to issue motor control commands to the amplifier subsystem. The profile generation subsystem may be further configured to 1) generate motor summary data based on the motor data, and 2) selectively output an error signal based on at least one of the motor data and motor summary data.

In further embodiments, the motor control module may include a local sub-host configured to generate module summary data based on the motor summary data, the error signal and profile generation subsystem status data, the local sub-host further configured to forward the module summary data to a motor control host. The amplifier subsystem may be further configured to generate the motor data based on at least one measured value of the motor.

The motor data, motor summary data and measured value may include one or more of motor temperature, motor winding temperature, average temperature, deviation of temperature and temperature drift. The motor data, motor summary data and measured value may include one or more of motor current, average current, deviation of current and current drift. The motor data, motor summary data and measured value may include one or more of motor position, position error, cumulative position error, motor velocity, velocity error, cumulative velocity error, motor acceleration, acceleration error, cumulative acceleration error, an amplifier component temperature, motor torque, motor jerk, a resonant frequency of the motor, and motor motion completion time. The amplifier subsystem may include a current sensor configured to measure a current at the motor and output current data to the profile generation subsystem. The motor summary data may include at least one of average current, deviation of current and current drift based on the current data.

In still further embodiments, the motor data may include indications of temperature and current of the motor, where the profile generation subsystem is further configured to 1) determine whether the temperature and current exhibit a drift, and 2) selectively output the error signal to indicate the drift. The profile generation subsystem may include a current loop unit, a position loop unit, and a profile generator. The current loop unit may be further configured to generate current summary data based on measured current at the motor, where the motor summary data includes the current summary data. The position loop unit may be further configured to generate position summary data based on measured positions of the motor, the motor summary data including the current summary data.

Further embodiments include a method of operating a motor control module. The method may include, at an amplifier subsystem, 1) driving a motor, and 2) outputting motor data indicating status of the motor. The method may further include, at a profile generation subsystem, 1) issuing motor control commands to the amplifier subsystem, 2) generating motor summary data based on the motor data, and 3) selectively outputting an error signal based on at least one of the motor data and motor summary data.

Still further embodiments include a method of operating a motor control module. The method may include, at an amplifier subsystem, 1) driving a motor, 2) generating motor data indicating status of the motor, and 3) generating motor summary data based on the motor data. The method may further include, at a profile generation subsystem, 1) issuing motor control commands to the amplifier subsystem; 2) receiving at least one of the motor data and motor summary data from the amplifier subsystem, and 3) selectively outputting an error signal based on at least one of the motor data and motor summary data.

Yet further embodiments include a method of operating a motor control module. The method may include 1) receiving first motor data indicating status of a motor, 2) calculating, at an amplifier subsystem, motor summary data based on the motor data, 3) determining, at a profile generation subsystem, whether the motor data exhibits a drift based on the, and 4) selectively outputting an error signal based on the drift.

Further embodiments include a motion system comprising first and second motor control modules. The first motor control module may include a first position loop configured to receive position encoder data from the a first motor and a second motor, where the first motor control module configured to control the first motor based on the position encoder data from the first and second motors. The second motor control module may include a second position loop configured to receive the position encoder data from the first and second motors, where the second motor control module configured to control the second motor based on the position encoder data from the first and second motors.

The second motor may be integral to a manual controller, and the second motor may be configured to 1) generate haptic feedback to a user, and 2) generate the position encoder data of the second motor as a function of a manual input by the user. A sub-host may be configured to generate motor control commands to the first and second motor control modules. A transform module may be configured to inverse transform a measured torque of at least one of the first and second motors and forward a transformed measured torque to the sub-host. A first motor subsystem may include the first motor control module and a third motor control module configured to control a third motor based on the position encoder data from at least one of the first and second motors. A second motor subsystem may include the second motor control module. The second motor subsystem may further include a fourth motor control module configured to control a fourth motor based on the position encoder data from at least one of the first and second motors.

Further embodiments include a method of operating a motor control module. The method may include, at a first processing block in a processing chain, 1) receiving first motor data indicating status of a motor, 2) calculating at least one of a mean and a standard deviation of the first motor data, 3) storing the first calculated data as a first stored value, 4) waiting a set period of time, 5) receiving second motor data indicating status of a motor, 6) calculating at least one of a mean and a standard deviation of the second motor data, 7) storing the second calculated data as a second stored value, 8) determining if a drift from the first stored value has occurred, and 9) outputting first summary data, the first summary data indicating at least one of the mean and a drift from a stored status value. The method may further include, at a second processing block in the processing chain, 1) receiving the first summary data indicating drift of a motor, and 2) determining an error action based on the drift of a motor.

BRIEF DESCRIPTION OF THE DRAWINGS

FIG. 9 illustrates and example motion profile using an S-curve velocity profile and also illustrates a cumulative position error.

DETAILED DESCRIPTION

Figure 1:
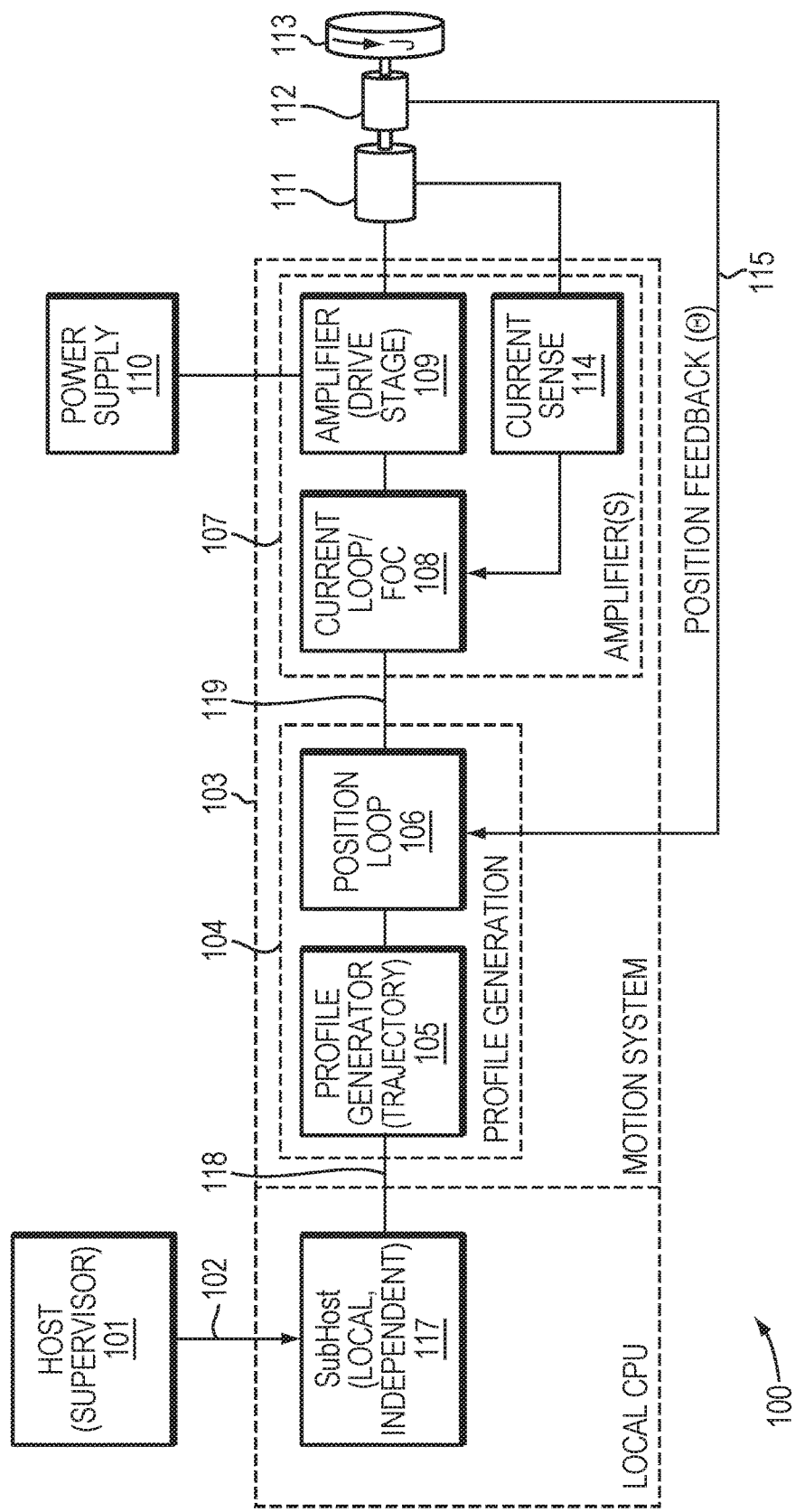
FIG. 1 illustrates motion control system in which embodiments of the invention may be implemented.

FIG. 1 is a block diagram of a motion control system 100 in which embodiments of the invention may be implemented. The system 100 includes a motion control system 103. An optional host computer 101 (often a Personal Computer, Single Board Computer, Central Processing Unit or Micro Controller) sends a command over connection 102 to a sub-host 117, which may be located near the motion system 103. The sub-host 117 may include a microcontroller or microprocessor able to execute a command with our without support from the main host 101. The sub-host 117 sends a command over connection 118 to a motion profile control system 104 that comprises of two major subsystems: a profile (or trajectory) generation system 105 and a position loop closure system 106. The profile generator system 105 generates a series of points over time for the position loop closure system 106 to execute. These points can also be generated by the higher level controllers 101 or 117 in which case the profile generator 105 is inactive.

The position loop closure system 106 receives a position feedback signal 115 from a position encoder 112 and compares that to the commanded generated by the profile generation system 105. A difference in position is sent as a signal 119 to an amplifier subsystem 107 that consists of three further distinct sub-systems: a current loop control system 108, an amplifier stage (also known as a drive stage) 109 and a current sense system 114 which senses the actual current in a motor 111. The amplifier stage 109 receives power from a power supply 110 which is used to power the motor 111. The motor 111 is usually but not always shaft coupled to a position encoder 112 and drives a load 113 which can be a mechanical system such as a belt, arm, slide or other mechanical system. The motion profile control system 104 may be implemented on an Integrated Circuit such as a Digital Signal Processor (DSP), Application Specific Integrated Circuit (ASIC) or microprocessor. Such a motion profile control system 104 can control multiple axis of motion simultaneously, which for clarity is not shown in the figure. The amplifier subsystem 107 can be an electronic circuit integrated on the same printed circuit board as the motion profile control subsystem 104 and sub-host 117, or can be a separate unit, communicating over signal connection 119 which can be a serial communication over parallel interface (SPI) or an analog voltage, usually a +10 to −10V signal or a pulse and direction signal or some other deterministic network connection.

Figure 2:
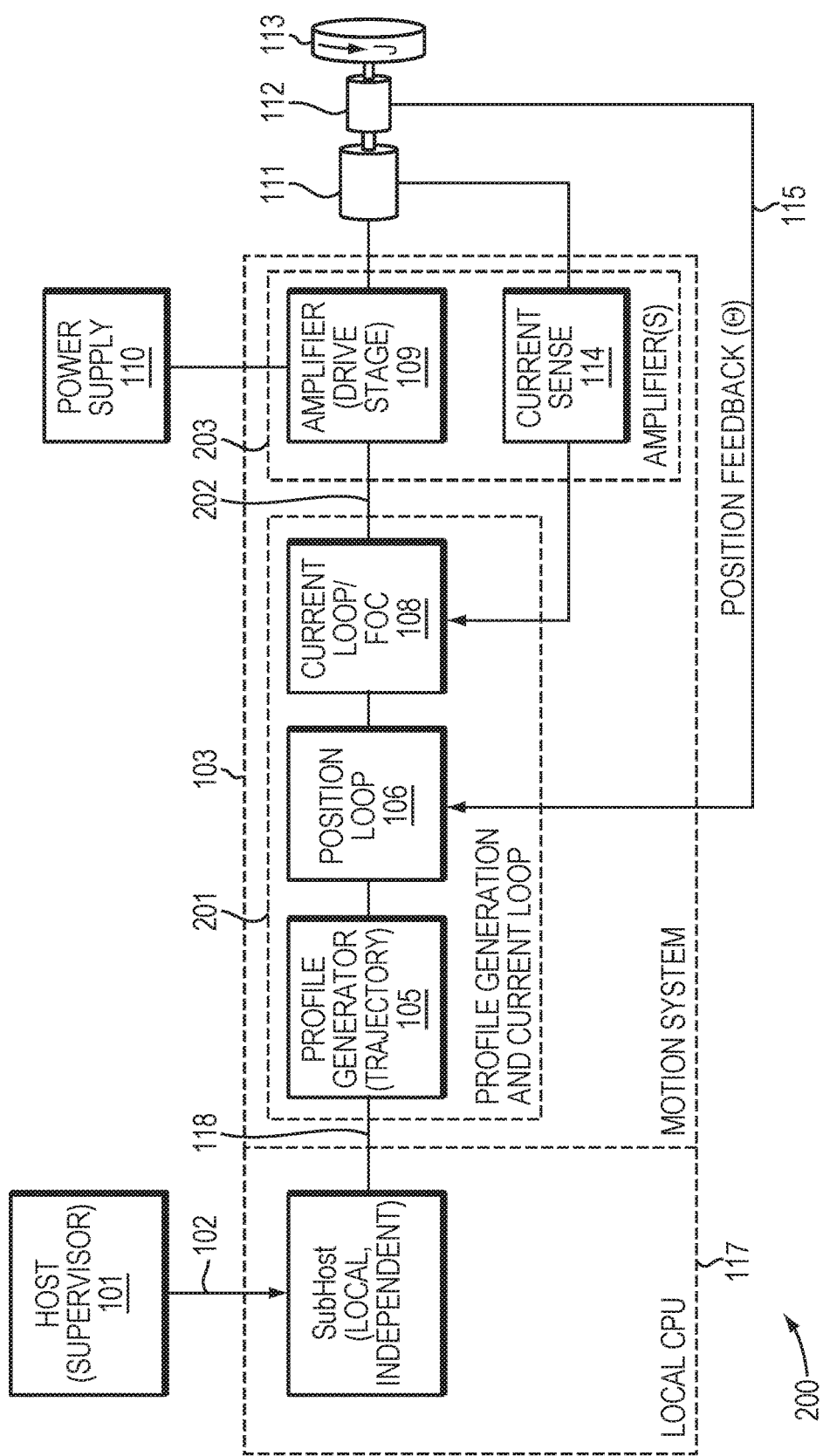
FIG. 2 illustrates a motion control system in a further embodiment.

FIG. 2 is a block diagram of a system 200 in which example embodiment may be implemented. The system 200 differs from the system of FIG. 1 particularly in that that the current loop control system 108 is a functional component of the profile generation system 201, which includes three major subsystems: the profile generation subsystem 105, the position loop closer subsystem 106 and the current loop closure subsystem 108. The main advantage of this configuration is that a tighter integration between the position control loop 106 and the current control loop 108 is possible, allowing for a more complex control system and better control over feedforward acceleration and velocity terms as described below. The amplifier section 203 may thus include two subsystems: the amplifier stage 109 and the current sense subsystem 114. The profile generation system 201 can be implemented as a single integrated circuit whereas the amplifier section 109 and the current sense section 114 are usually larger systems each containing multiple components. The motion profile control system 201 is often implemented on an Integrated Circuit such as a Digital Signal Processor (DSP), Application Specific Integrated Circuit (ASIC) or microprocessor. Often times such a motion profile control system 201 can control multiple axis of motion simultaneously, which for clarity is not shown in the figure. The amplifier subsystem 203 can be an electronic circuit integrated on the same printed circuit board as the motion profile control subsystem 201 and sub-host 117, or can be a separate unit, communicating over signal connection 202 which can be a serial communication over parallel interface (SPI) or an analog voltage, usually a +10 to −10V signal or a pulse and direction signal or some other deterministic network connection.

Figure 3:
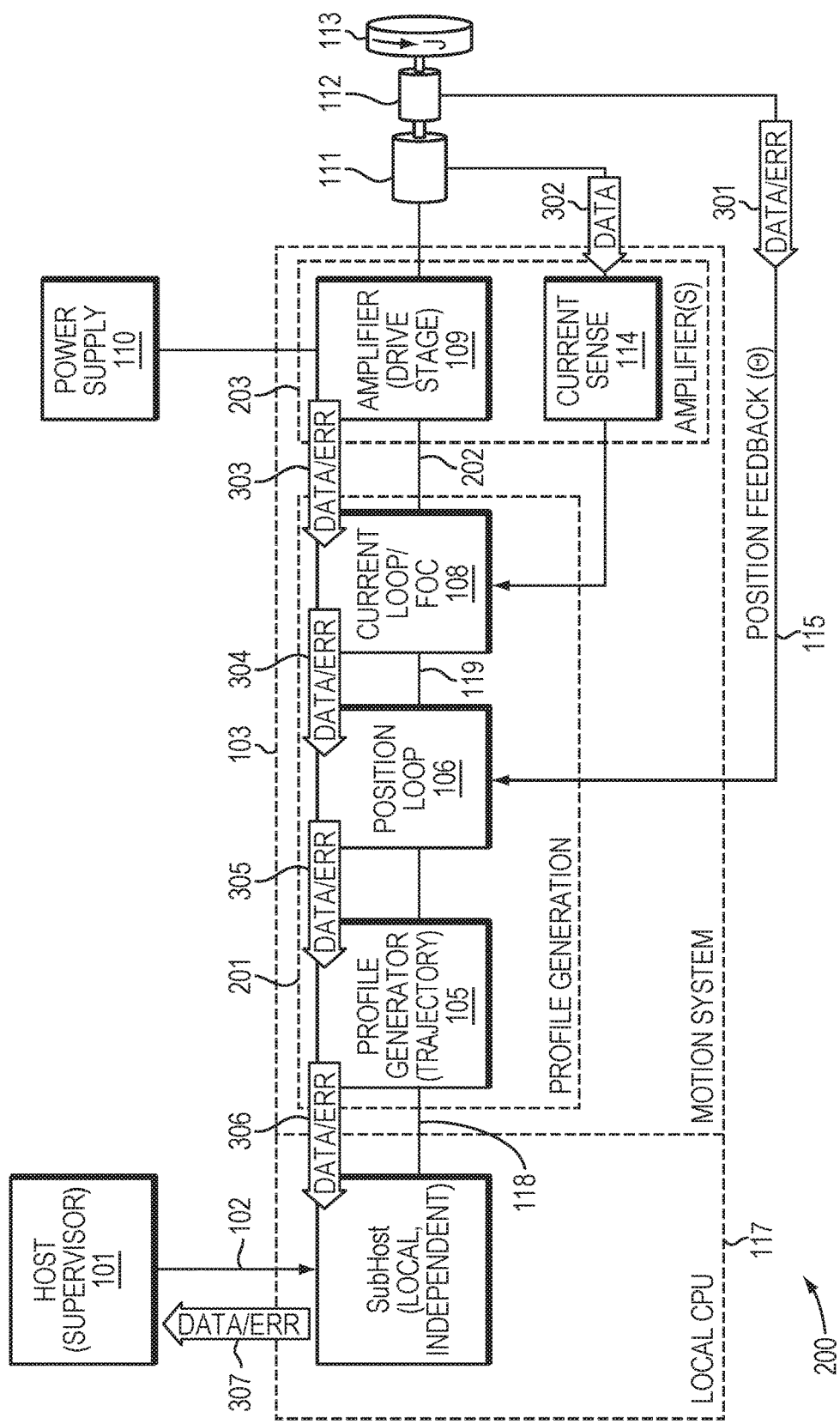
FIG. 3 illustrates the flow of measurement data and sources of error-messages by some of the local subsystems of the motion control system of FIG. 2.

FIG. 3 illustrates data flow in the system 200 of FIG. 2. Position data (and possible error data) 301 are sent as part of the position feedback signal 115 which comes from the encoder 112 or Hall sensors (not shown) as part of the motor 111 itself. Motor data (such as current in a winding) 302 is sent to the current sense subsystem 114. Generally the data thus generated is passed on from the amplifier stage 109 through the current loop subsystem 108 as a data stream 303 to the position loop system 106 and on to the profile generator 105 as data streams 304 and 305 respectively and further on through the sub-host 117 and ultimately to the host 101 as data streams 306 and 307 respectively. Oftentimes a limit is implemented somewhere along the data streams 303 through 307 and if such a limit is exceeded and error is sent further upstream instead. In increasingly complex motion systems the amount of data generated in the subsystems can be substantial and in order to understand errors a host 101 or sub-host 117 system often needs direct access to the underlying measurement data. It is often unclear however what the underlying data trends are and often the host 101 or sub-host 117 collects a substantial amount of data and requires a substantial amount of resources and data storage facilities to perform data analysis and trending. This increases the required performance parameters of the processors involved in the host 101 and/or sub-host 117 and increases the amount of network communications between the subsystems over interface connections 202, 119, 118 and 102.

Figure 4:
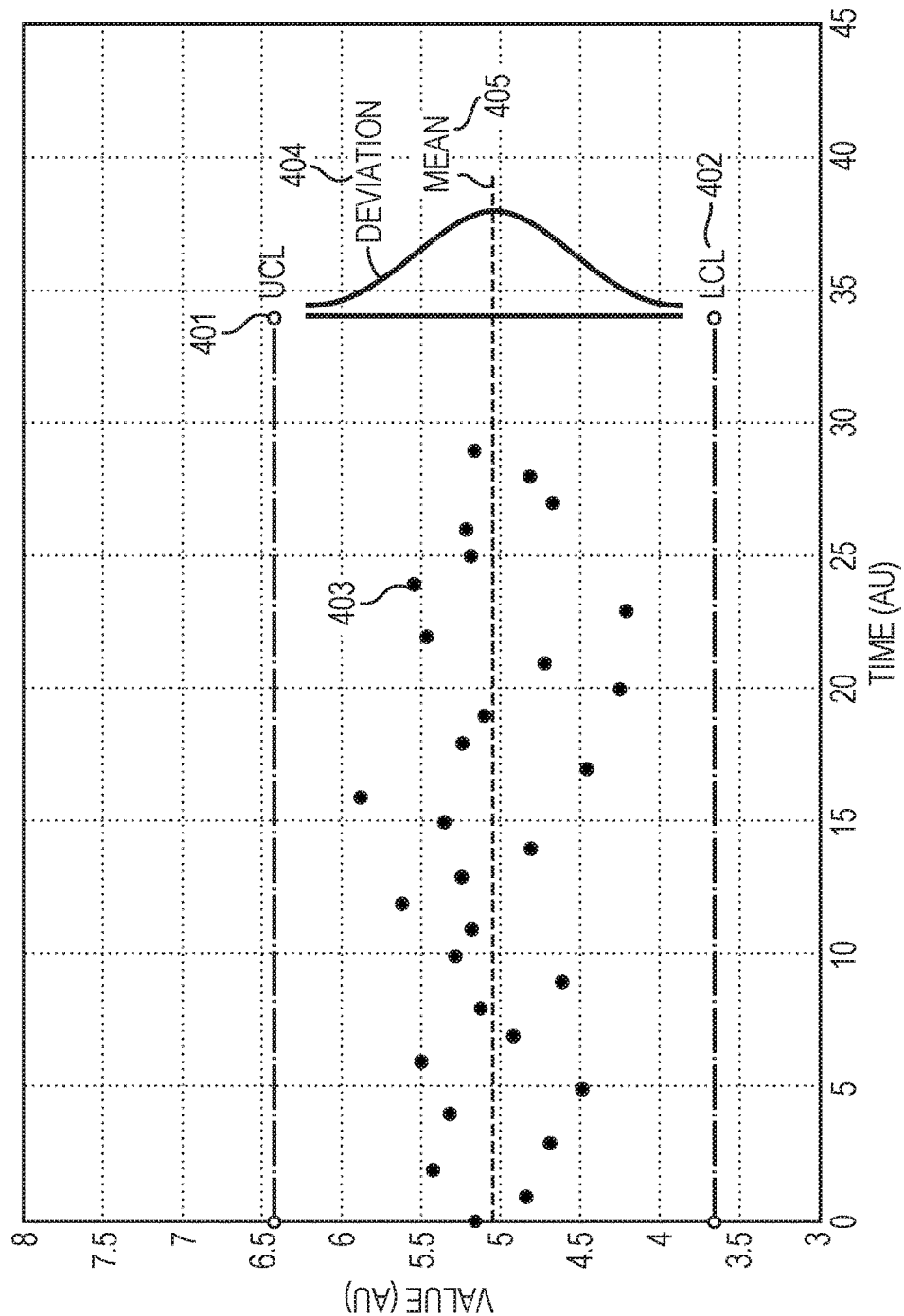
FIG. 4 shows a measurement graph of a single motion system parameter as a function of time with example control limits.

FIG. 4 shows a hypothetical series of measurements of a motion parameter as function of time. The parameter can be any parameter associated with the motion system such as a position, position error, cumulative position error, velocity, velocity error, cumulative velocity error, acceleration, acceleration error, cumulative acceleration error, a current, a temperature, a torque, a jerk or any other measurable or observable or derived parameter in the motion system including combination parameters from simultaneously running multiple axis and control systems. A motion parameter may have an upper control limit (UCL) 401 or a lower control limit (LCL) 402 or both or additional soft warning limits (not shown). If one of the measurements 403 exceeds one of the limits an error is generated and sent upstream through the motion control system as described in the previous figure. However, in the motion systems known in the art the data and errors thus generated are often simply sent up stream as described earlier as well. It would be very useful for the motion system to be able to generate local statistics such as a Mean 405 and Deviation 404.

Figure 5:
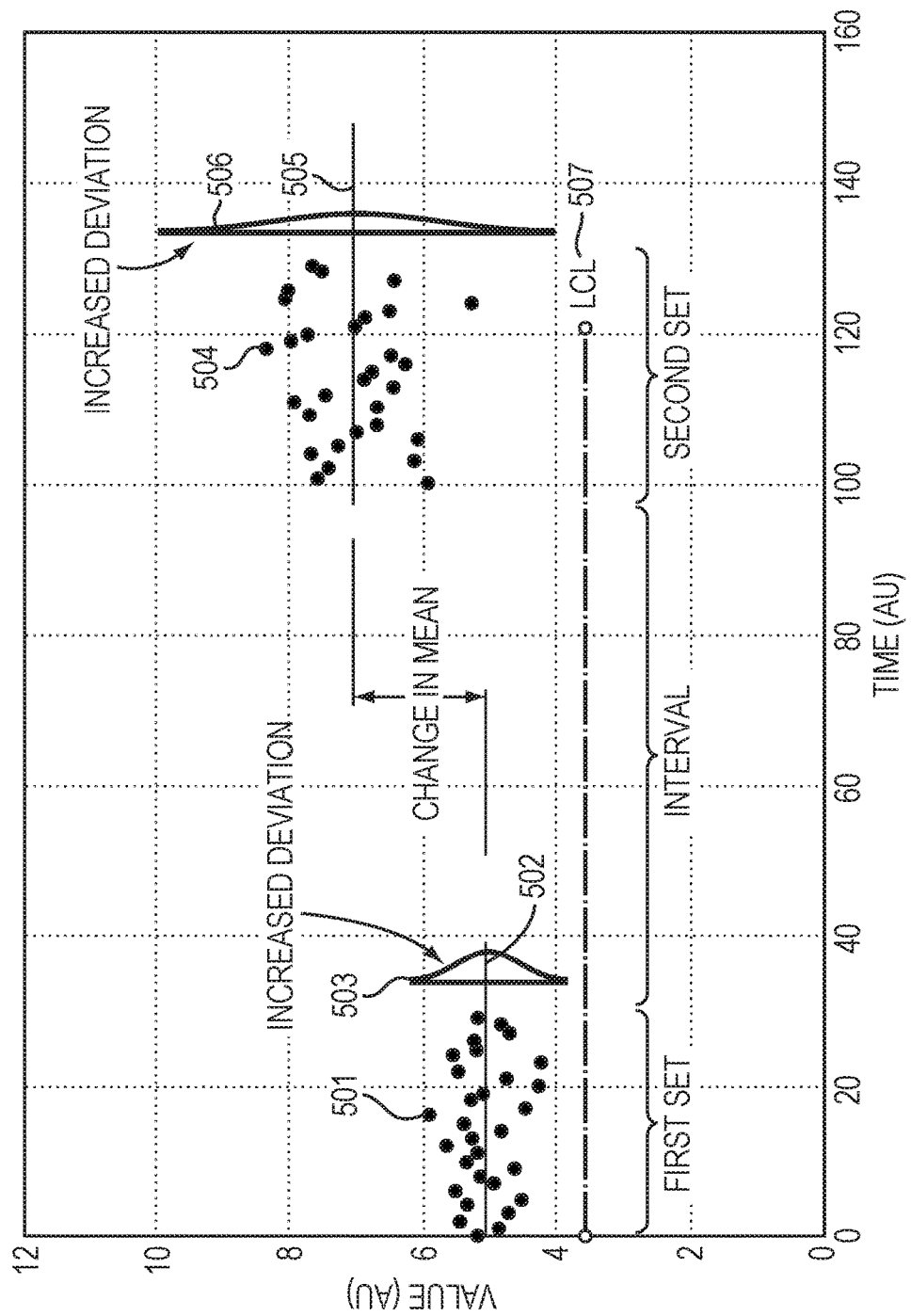
FIG. 5 illustrates the concept of drift in a measurement of a single motion system parameter with repeated measurements of the parameter with an interval of time between measurement sets.

FIG. 5 illustrates two different example datasets 501 and 503 separated by a time interval. In the present example a first data set 501 is collected with enough samples to be able to calculate a mean 502 and deviation 503 with a reasonable certainty (e.g., 30 measurement points). In the present example, a lower control limit LCL 507 is implemented as a means of control. After a time interval, a second data set 504 is generated and a new mean 505 and deviation 506 are calculated on the second data set 504. In the present example, both the mean and the deviation have changed measurably although the lower control limit LCL 507 was never exceeded.

Figure 6:
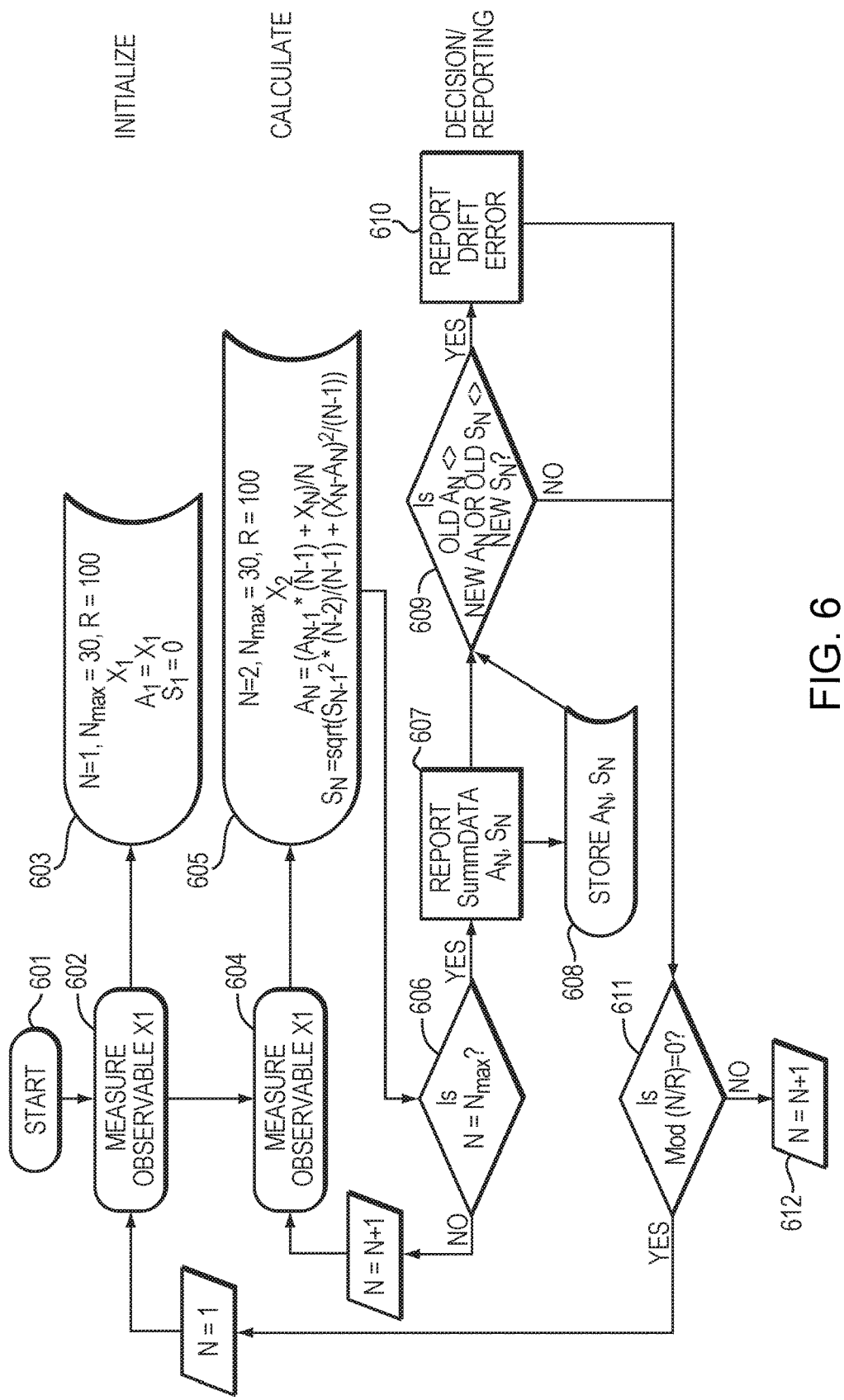
FIG. 6 shows a possible calculation flow diagram that measures multiple data sets separated by an interval and calculates a running mean and deviation while providing an error if a measurement set exhibits drift outside of preset parameters.

FIG. 6 shows a block diagram of an example method to generate a mean and deviation without requiring a large memory space to be utilized. At the start 601 of the measurements 602, a number of initial values are set 603 such as a counter N=1, a maximum number of measurements in the data set $N_{max}$=30, a repeat interval R=100, and an initial guess for the mean $A_1$ which is set to the first measurement value $X_1$ and deviation $S_1$ which is set to 0. The value for the repeat interval can be set to ignore a number of measurements or may be set to 0, meaning that the second set immediately starts after the first data set is completed. The next variable $X_N$ for N=2 is measured in 604 and the running mean $A_N$ and deviation $S_N$ are updated with the formula in 605:

$$A_N=(A_{N-1}*(N-1)+X_N)/N$$

and $$S_N=\text{sqrt}(S_{N-1}^{2}*(N-2)/(N-1)+(X_N-A_N)^2/(N-1))$$

The sequence of measurements is repeated through 606 until N=$N_{MAX}$ and the last values of $A_N$ and $S_N$ for N=$N_{MAX}$ are stored 607. If the repeat interval R has been reached in 611, the measurements are repeated and a second data set is generated using the same process. If the repeat interval R has not been reached 612 increments N and the sequence ignores measurements until the repeat interval is reached and a new measurement set is started. The new $A_N$ and $S_N$ values are compared to the stored values in 609 and if they are significantly different can be reported upon as a drift error 610. The sequence from FIG. 6 only required a small number of variables to be stored and updated (N, which can also be time, R, $N_{MAX}$, $A_N$, $S_N$ and some optional variables that can be set to determine when to report a drift error, for example a variable X that can control for the drift in the mean and a variable Y that can control for a drift in the deviation. Because the above calculation scheme can be implemented at a low level of the motion system, for example on the amplifier 109 in FIG. 1 or on the motion control subsystems 105, 106 and 108 in the same figure. Because the amount of memory available at these subsystems is usually limited and, because the communication bandwidth is primarily reserved for motion related signals, the data-reduction scheme from FIG. 6 can be used to significantly reduce the amount of signal traffic and memory usage in and between the subsystems 105, 106, 108, 109 and the sub host 117.

Figure 7A:
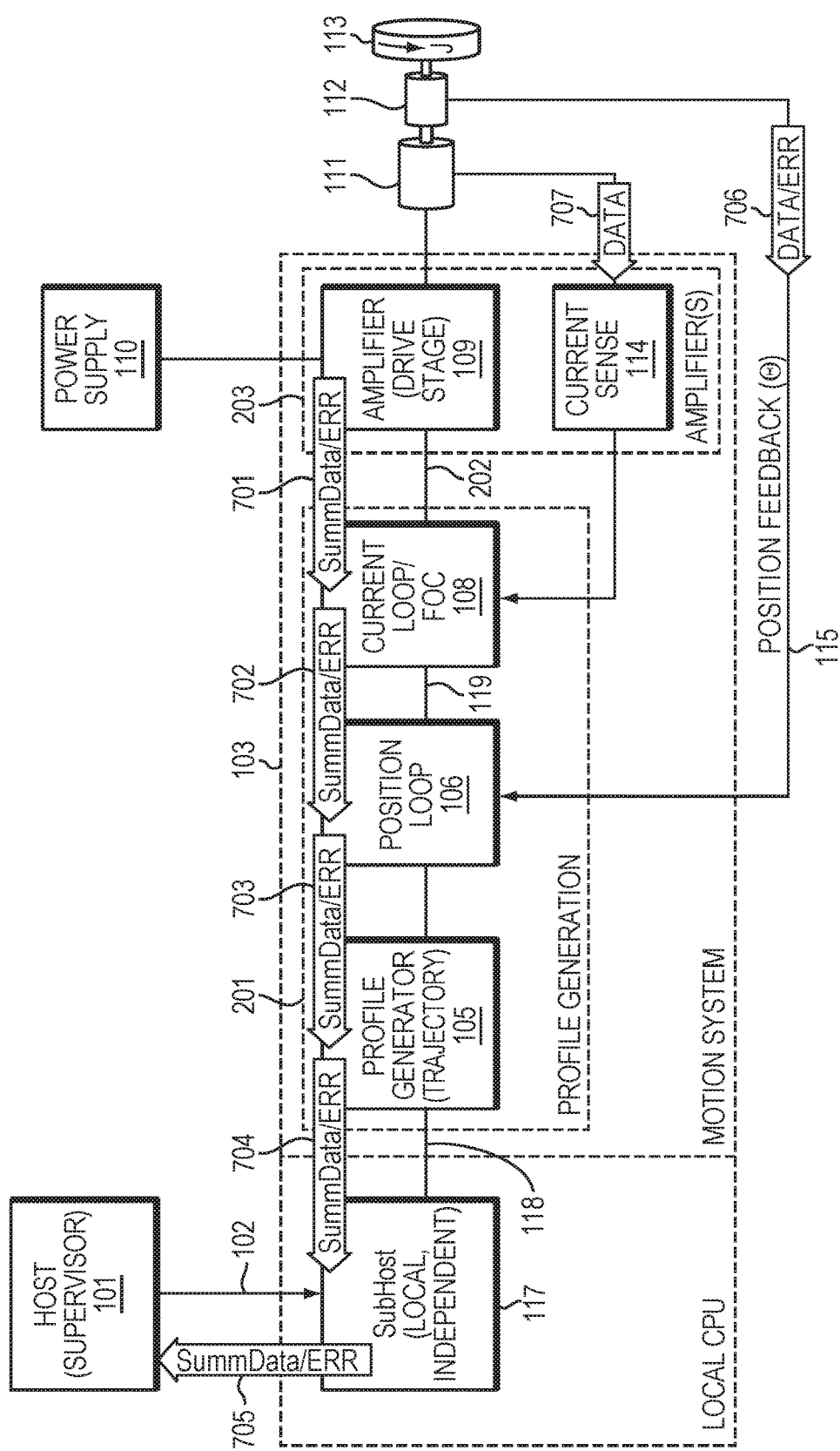
FIG. 7A illustrates the reduced summary dataflow and errors in the motion control system of FIG. 2.

FIG. 7A is a block diagram of the system 200 illustrating how motor summary data from FIG. 6 can be implemented across a motion control system 103. The amplifier stage 109, rather than providing a continuous stream of measurements, instead provides a calculation of summary data as in FIG. 6 and passes the summary data and error messages 701 to the current loop system 108, which can pass on such summary data or generate its own summary data and errors 702 to the position loop system 106 which again can pass it on or generate its own summary data and errors and send them over connection 703 to the profile generation subsystem 105 which can generate its own summary data and errors and send them on to the sub-host 117 over connection 704, which can react to them or send them on 705 to the host 101. There may be additional data 707 from the motor 111 and data or errors 706 from the encoder 112, which can either be passed on or processed as described above by the various subsystems. In this way a much better understanding of parameter drift in the various subsystems can be attained while at the same time reducing signal traffic between subsystems.

Figure 7B:
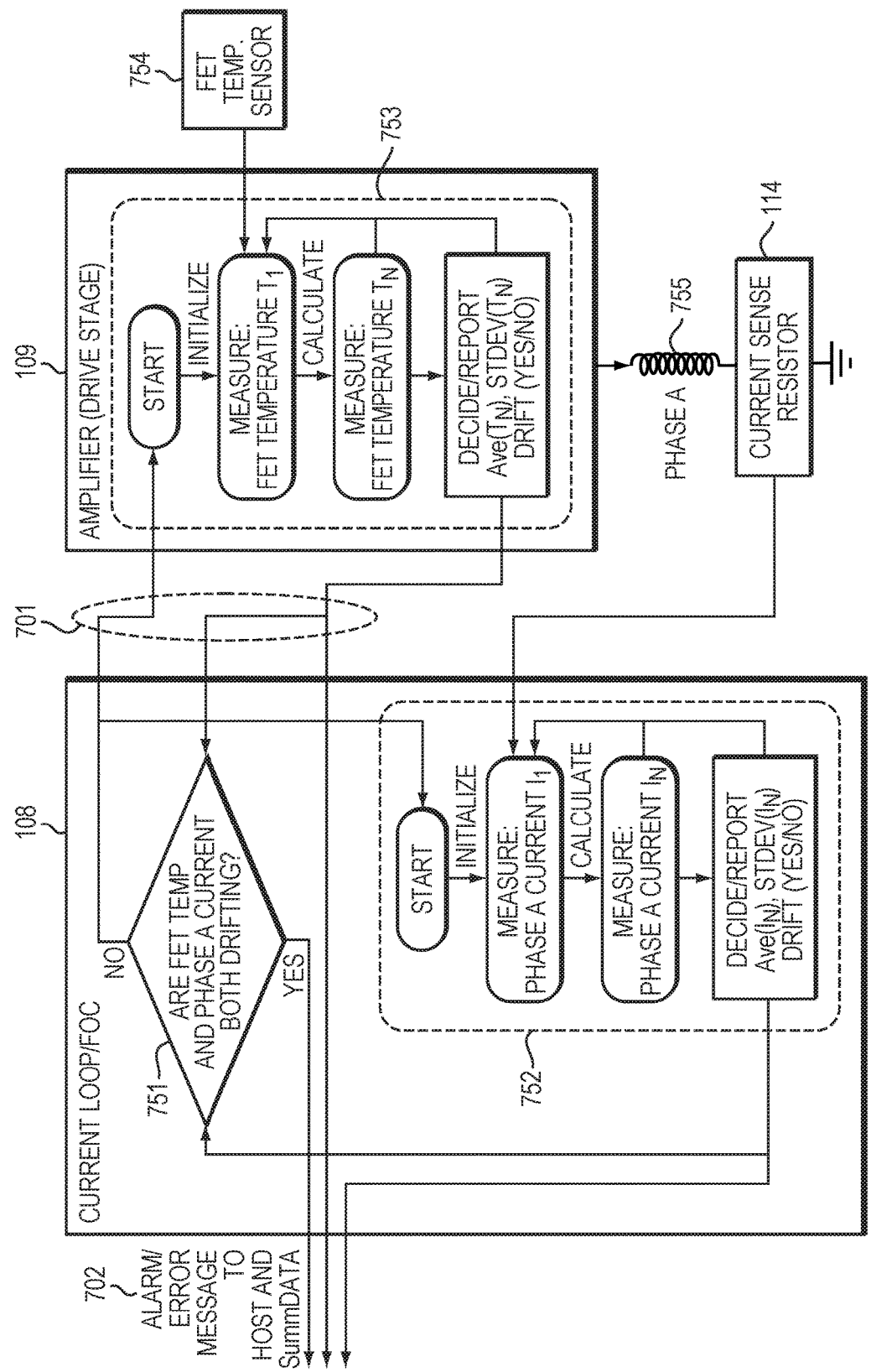
FIG. 7B illustrates an example of reducing a dataflow in an amplifier module and comparing its measurements and summary data with a dataflow in a current loop module, which also has its own measurements and summary data.

FIG. 7B is a block diagram illustrating an example of generating summary data and Alarm/Error generation in the two lowest-level modules (the current loop/FOC module 108 of FIG. 1 and the amplifier module 109 of FIG. 1) and how this data can be compared and used at a low level to report trends only from a motion control subsystem. In the present example, a temperature sensor 754 for example connected to a Field Effect Transistor (FET) senses the temperature of the FET. A section of embedded code 753, which is a simplified representation of the calculation flow of FIG. 6, is initialized and a trend of the FET temperature is calculated as has been explained above. Both the initial FET temperature (average and standard deviation) are measured and if a drift or change is detected, the information (average, drift rate etc) is passed through communication channel 701 to the Current Loop/FOC module 108 as was shown in FIG. 7A. The information from the amplifier can be passed directly further upstream to for example a position loop module 106 as was shown FIG. 7A, but it can also be used in the Current Loop/FOC module 108 and (for example) can be compared to other measurements in the Current Loop/FOC module 108. In the present example, the Current Loop/FOC module also measures the current in a Current Sense Resistor 114 which is used to measure the current in a winding 755 of a motor. A second section of embedded logic code 752 is initialized and a drift and deviation is measured and compared to the initialization measurements, as described above with reference to FIG. 6.

The resulting information is sent to an additional set of logic code 751, which compares the information from the Amplifier logic 753 with the information from the local current measurement 752 and decides to send an error over interface 702 to the next higher level controller as was shown in FIG. 7A. At each level of the control system, multiple measurements can be made, averaged and trend analyzed and those results can be sent to a higher level control logic code where they are combined with additional measurements of local sensor trends or can be sent straight on to a yet higher level controller. This approach results in a significant reduction in data across the communication channels 701, 702 etc. because only errors or drifts and changes in deviation are reported and combined with other variables measured at a higher level.

Figure 8:
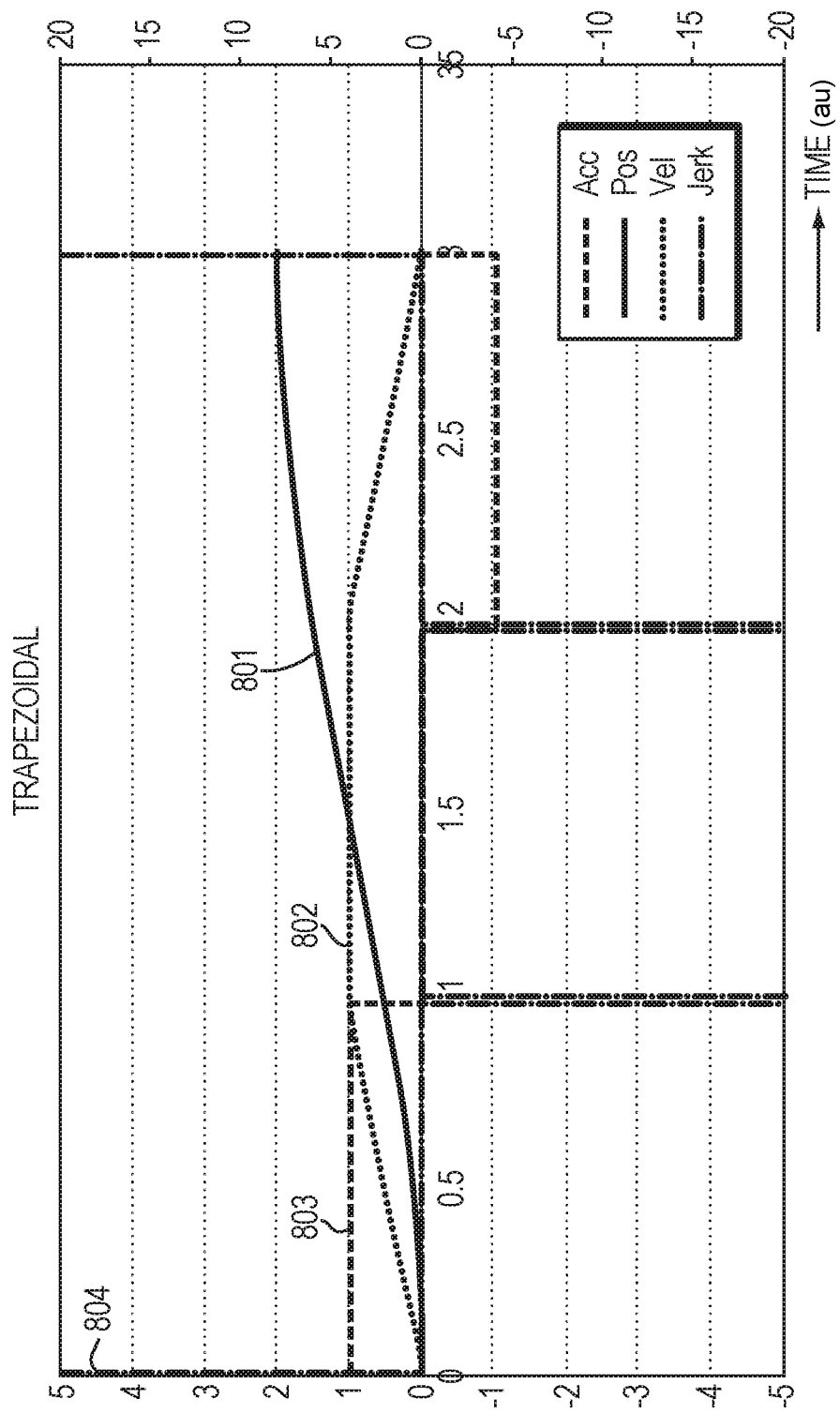
FIG. 8 illustrates and example motion profile using a trapezoidal velocity profile.

FIG. 8 shows an example of several motion system parameters, such as position 801, velocity 802, acceleration 803 and jerk 804. In the idealized trapezoidal motion of FIG. 8 the jerk is essentially infinite because of the initial acceleration at time t=0. Such a system is often not optimal because the high jerk will cause significant vibrations in the system and many methods have been derived to overcome these limitation while still allowing for fast move times. One such approaches is the use of "S-curve" motion parameters such as is shown in FIG. 9. The acceleration curve 905 now resembles a more trapezoidal profile, which significantly lowers the jerk profile 906. The velocity profile 904 and position profile 901 are similar as in FIG. 8, but the actual position 902 will vary somewhat from the commanded position profile 901. One may determine an absolute difference between the commanded profile 901 and the actual position profile 902 and continually sum the absolute difference into a cumulative absolute difference 903. Using the scheme described in FIG. 6, the final cumulative error 907 may be stored and on a subsequent moves measured again. The motion profile subsystem 105 in FIG. 1 and FIG. 2 may be used to calculate such motion data on a move to move basis. It is also possible to measure other motion systems variables such as differences in commanded velocity, acceleration and other motion parameters of interest.

Figure 10A:
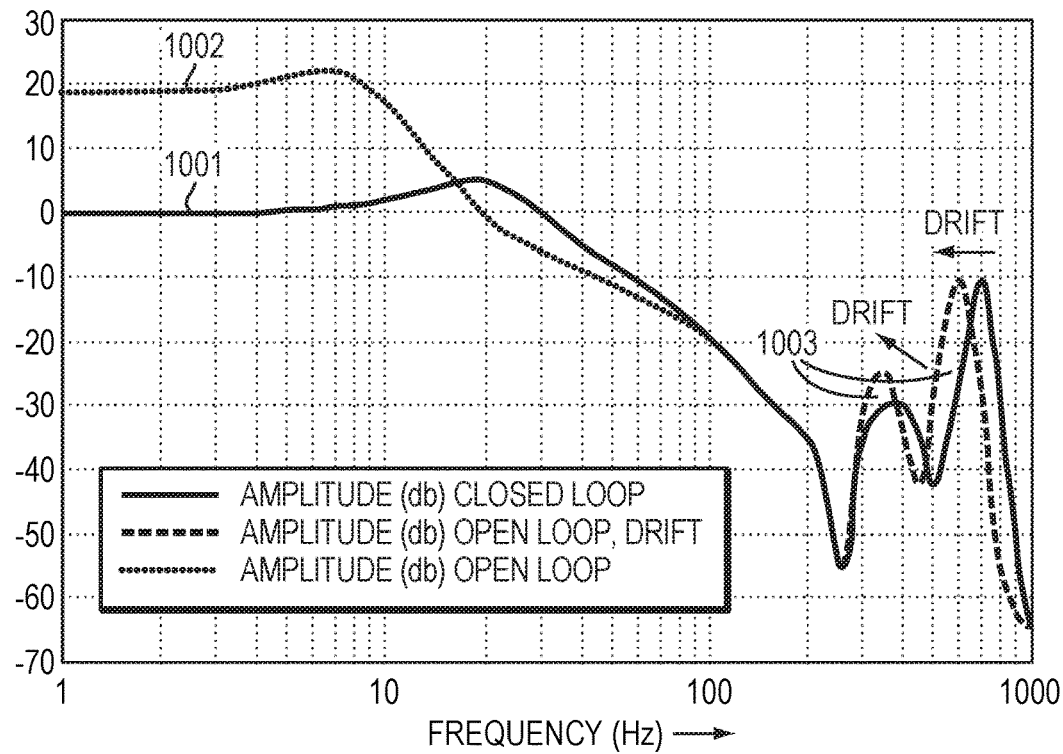
FIG. 10A illustrates the amplitude signal response in a Bode plot of a mechanical system coupled to a motion control system which exhibits resonant frequency drift between subsequent Bode plot measurements.
Figure 10B:
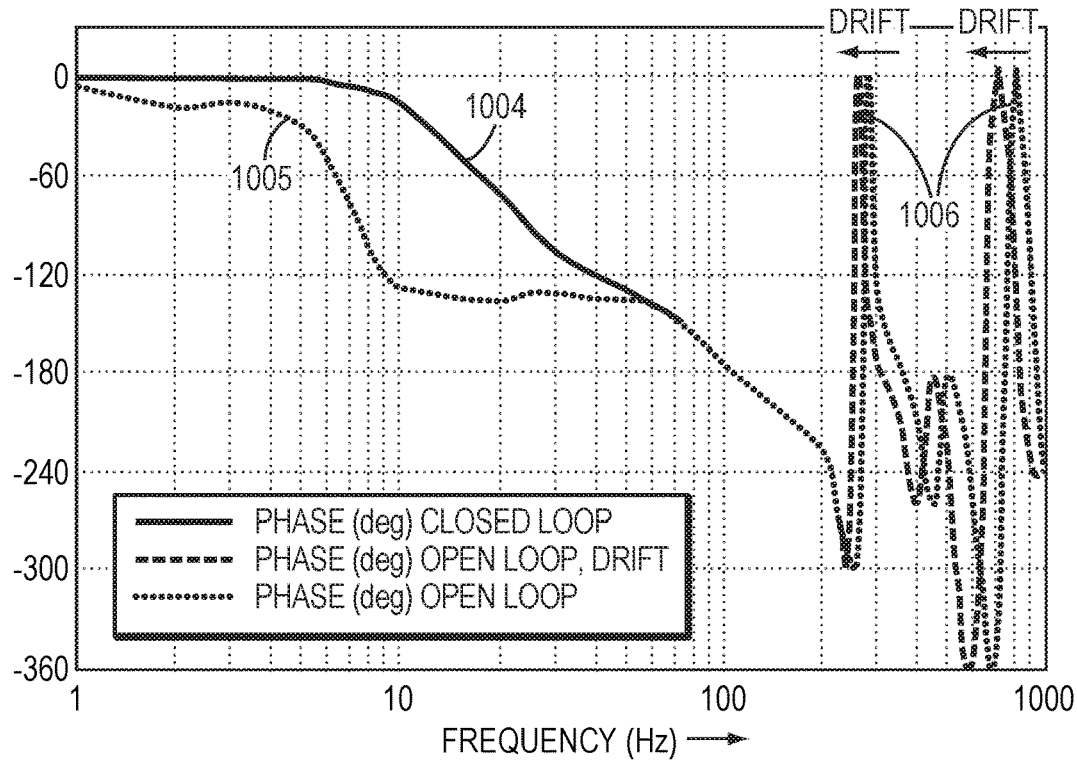
FIG. 10B illustrates the phase signal response in a Bode plot of a mechanical system coupled to a motion control system which exhibits resonant frequency drift between subsequent Bode plot measurements.

Another example of a parameter set of interest is shown in FIG. 10A and FIG. 10B. FIG. 10A illustrates the amplitude response of a motion system as a result of sending a sinusoidal motion signal to the motor (known as a Bode plot). The open loop amplitude response 1002 and closed loop amplitude response 1001 are a result of when the position loop control 106 from for example FIG. 1 is engaged. Conversely in FIG. 10B the open loop phase response 1005 and closed loop phase response 1004 are shown. A Bode plot as shown in the figures can often only be generated when a motion system is idle. The example Bode plot of FIG. 10A and FIG. 10B can be generated over a wide frequency domain say from 1 Hz to 1,000 Hz. This allows one to find resonant frequencies 1003 in the amplitude or 1006 in the phase domain. The resonant frequencies are usually associated with the mechanical response of the motor 111 system to the load 113. After establishing the primary resonant frequencies 1003 and 1006, a much shorter Bode plot may be generated for example by only scanning frequencies around the resonance say from 300 to 400 Hz. If in subsequent Bode scans a drift of the resonant frequency is observed that may mean a mechanical change has occurred in the system, for example a bearing may have worn, or a transmission belt may have loosened. As in the previous example, the motion subsystem 106 may generate these Bode plots at predetermined intervals and use the approach of FIG. 6 to store and compare the values of the resonant frequencies. Again the advantage of this method is that one does not have to store all the measurement values of the Bode plot, but rather a measured frequency maximum 1003 or 1006 may be stored and compared in subsequent Bode plots. This again reduces the amount of signal traffic and relieves the sub-host from having to store all the data and computing the drift of the resonant frequencies, rather the information is calculated at a low level and sent up as summary (drift) data instead of being sent as raw measurement data.

Figure 11A:
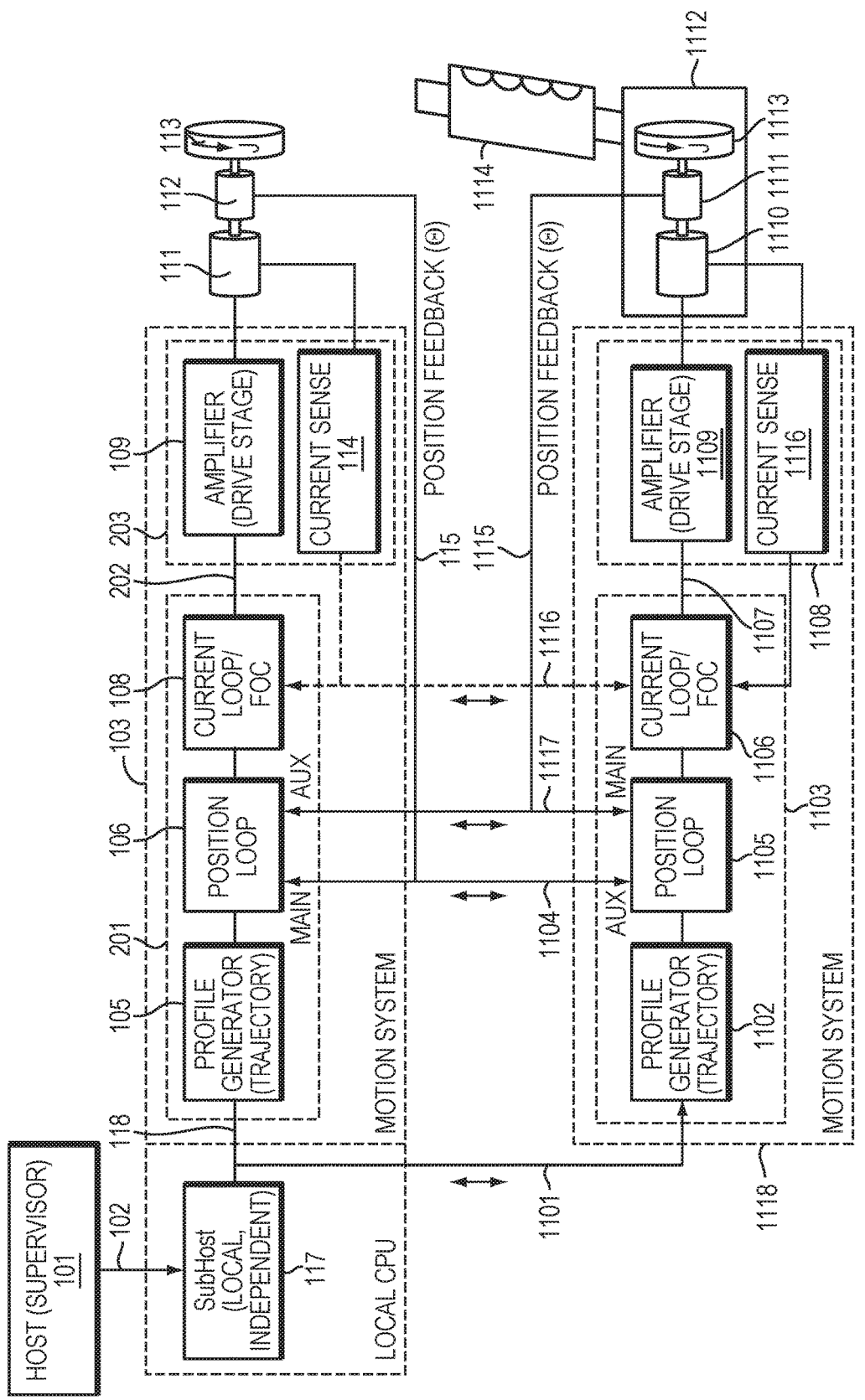
FIG. 11A shows a first motion control system of FIG. 2 coupled to a mechanical motor/encoder system, wherein the first motion control system is also coupled to a second motion control system, which in turn is coupled to an operator input system.

FIG. 11A illustrates a system 1100 that integrates the motion control system 103 of FIG. 1 or FIG. 2 can be integrated with a second motion control system 1118 to provide a sensible feedback to an operator through means of a motor 1110, encoder 1111 and load 1113 integrated to a handheld device 1112 such as for example a Joy Stick handle 1114. Motor 1110 creates a vibration by means of an asymmetrical load 1113 or creates a torque if load 1113 is coupled directly to the handle 1114. Either the vibration or torque can be sensed by a human operator. The first motor 111 creates a force on the load 113 and this load is detected through current sense 114. It is also detected by the position loop 106 which will see a difference between a commanded position and an actual position as measured by the encoder 112. As discussed before, the actual torque measured by current sense 114 or the difference in position measured by the position loop 106 can be passed through the motion systems 105, 106 and 108 to the sub-host 117 or host 101, which can then, in turn, send a motion command 1101 to the second motion system 1118 coupled to the handheld device 1112.

The second motion system 1118 may include components comparable to those of the first motion system, such as a profile generator 1102, a position loop controller 1105, a current loop controller 1106, an amplifier 1109, and a current sense 1116. The motion subsystem 1103, consisting of the profile generator 1102, position loop controller 1105 and current loop controller 1106 can be integrated into a single integrated circuit such as a DSP, or CPU as described earlier. The position of the handheld device 1112 or more specifically the handle 1114 is determined by encoder 1111 which signal 1115 is fed back to the position loop controller 1105 which in turn can send the position signal back through the profile generator 1103 to the sub-host 117. By coupling the two motion systems over interface 1101 the hand held device 1112 can be used to control the motor 111 and at the same time the torque or resistance measured on motor 111 by current sense 114 can be fed back to the hand held device 1112 and a handle 1114 can be made to vibrate or receive a torque giving the operator a feeling of the torque in motor 111. This arrangement, however, results in a large amount of messages 1101 between the two motion systems 103 and 1118. It is possible however, to create a control architecture by taking the current sense output 114 and not only directing it to the main current loop 108, but also directing it through connection 1116 to the current loop 1106 of the second motion system. By coupling the current sense signal to both motion systems, a significant amount of messaging 1101 can be eliminated, and reaction time can be reduced.

Further, the position loop controller 106 often can receive two encoder inputs (commonly known as an auxiliary encoder). One can take advantage of this additional encoder interface by coupling encoder 112 through position feedback signal 115 to both position loop 106's main encoder interface and at the same time coupling the same signal though 1104 to the auxiliary encoder interface on position loop controller 1105. Likewise encoder 1111 from the hand held device 1112 can be interfaced through position feedback signal 1115 to the position loop controller 1106 of second motion system as well as through connection 1117 to the auxiliary encoder interface of position loop controller 106 of the first motion system. By routing the signals in this fashion the motion systems become essentially coupled and the positions are closely tracking between the handheld device 1113 and the motor 111. The two motion systems 103 and 1118 can be implemented to run on a single IC, such as a DSP, ASIC, FPGA, CPU or other processor and that the present system can easily be extended to multi-axis systems as well. For example, the hand held device 1112 can have two or more degrees of freedom, each of which is separately couple to one or more motion systems 103 either directly or through means of a kinematics calculation that contains the translation parameters between the hand held device 1112 and the mechanical system connected to motor 113.

Figure 11B:
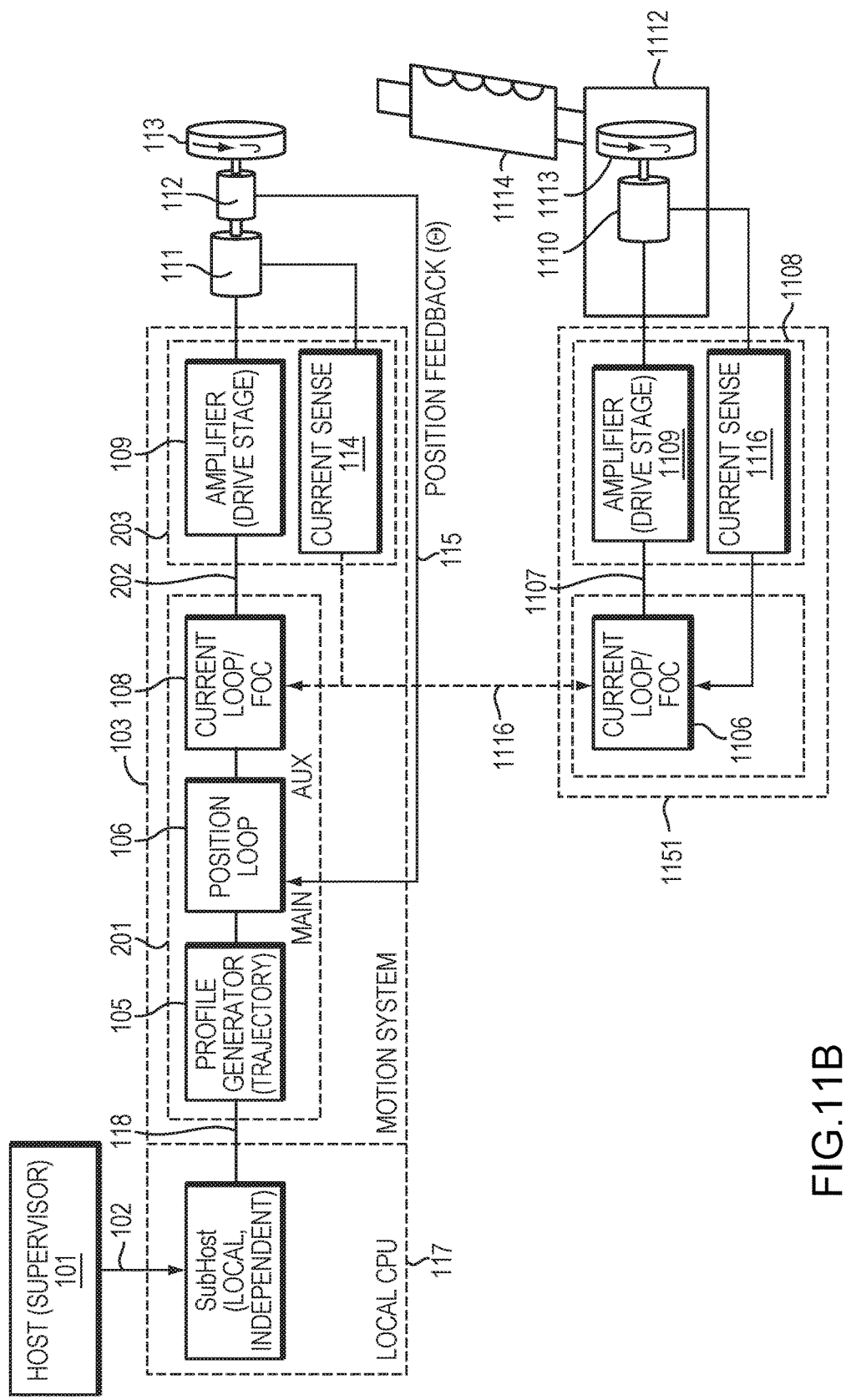
FIG. 11B shows a modified version of the system in FIG. 11, wherein the second motion control system only contains a drive stage for coupling to an operator input system.

FIG. 11B illustrates a system 1150 in a further embodiment. The system 1150 may be comparable to the system 1100 described above, but is simplified by reducing the number of included components. In particular, the second position control profile generator has been eliminated and the second motion system 1151 is reduced to essentially a current loop control 1106 and an amplifier 1109. The encoder in the motor 1110 can also be eliminated in certain situation, particularly when the position of the handle 1114 is not needed, such as the case when the feedback is a vibrational feedback generated by rotating the motor 1110 with an asymmetric load 1113. In some situation even the current feedback and current sense 1116 can be eliminated as well.

Figure 11C:
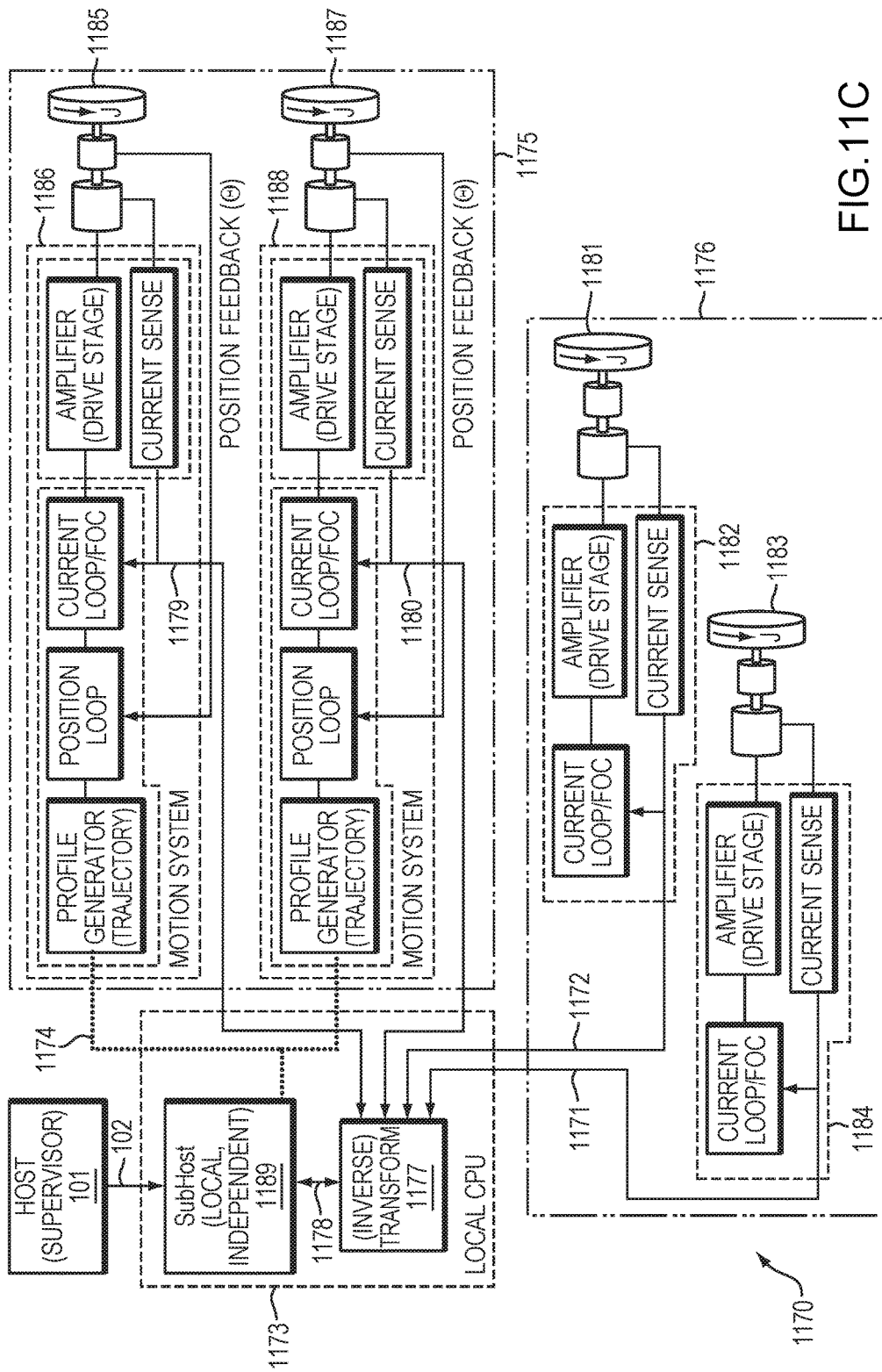
FIG. 11C illustrates a system in a further embodiment, wherein two 2-axis systems are connected through a local sub-host that manages the motion transforms between the two 2-axis systems.

FIG. 11C illustrates an example system 1170 in a further embodiment, wherein two multi-axis systems are connected through a local sub-host 1189, which manages the motion transforms between the multi-axis systems. As shown in FIG. 11C, two 2-axis systems 1175, 1176 are coupled through a local CPU 1173, which also calculates transforms between the two 2-axis systems. In further embodiments, the systems 1175, 1176 may include one or more additional axes. For example, the first two axis system 1175 may be a two-axis robot arm, and the second two-axis system 1176 may be a two-axis joy-stick controller. Current commands (which may be proportional to a torque command) 1171 and 1172 are given by the local CPU 1173 through a transform unit 1177 to the two-axis controllers 1182 and 1184, which are connected to the motor/encoders 1181 and 1183 respectively. At the same time, axis controllers 1182 and 1184 also sense the current (torque) in the motors 1181 and 1183 and send these values back to the transform unit 1177, which can inverse transform them to be used by the sub-host 1189. The local sub-host 1189 can also send current (torque) commands through the transform unit 1177 to the other two-axis system 1175 though connections 1179 and 1180. In applications where the two 2-axis systems 1175, 1176 are communicatively coupled (e.g., the second system 1176 is implemented in a two-axis joystick controller to control the first system 1175 implemented as a two-axis robot arm), the transform unit 1177 may operate to transform commands and/or operation data between the systems 1175, 1176. In further embodiments, the transform unit 1177 may be embodied by two separate transform units, where each transform unit interfaces with a respective one of the systems 1175, 1176.

The first 2-axis system 1175 includes two axis controllers 1186 and 1188 and two motor/encoders units 1185 and 1187. The axis controllers 1186 and 1188 can run in torque mode as shown, but can also run in position loop mode as shown in light grey. By operating in position mode, the sub-host 1189 can use positions and trajectories to define for example exclusion zones and areas where the robot arm is not supposed to operate, regardless of the commands given by the second 2-axis system 1176. Simultaneously, the two axis controllers 1186 and 1188, also send current sense information (torque) back to the sub-host 1189 through the inverse) transform computational unit 1177. It is possible to develop a single-transform computational unit, such as an FPGA, ASIC, DSP or similar microprocessor, that combines the functionality of (inverse) transform unit 1177 and sub-host 1189 into a single unit. The (inverse) transforms reflect the mechanical systems used, and a generalized solver (e.g., Pikaia optimization program) can be used to simultaneously solve the forward and inverse kinematics. Sub-host 1189 may not be necessary for inclusion except for setting up the system and for starting and stopping the (inverse) transform unit 1177, with the possible exception of providing exclusion volumes as discussed earlier. As soon as the system is operational, (inverse) transform unit 1177 can coordinate the movement between the two 2-axis systems 1175 and 1176.

Figure 12:
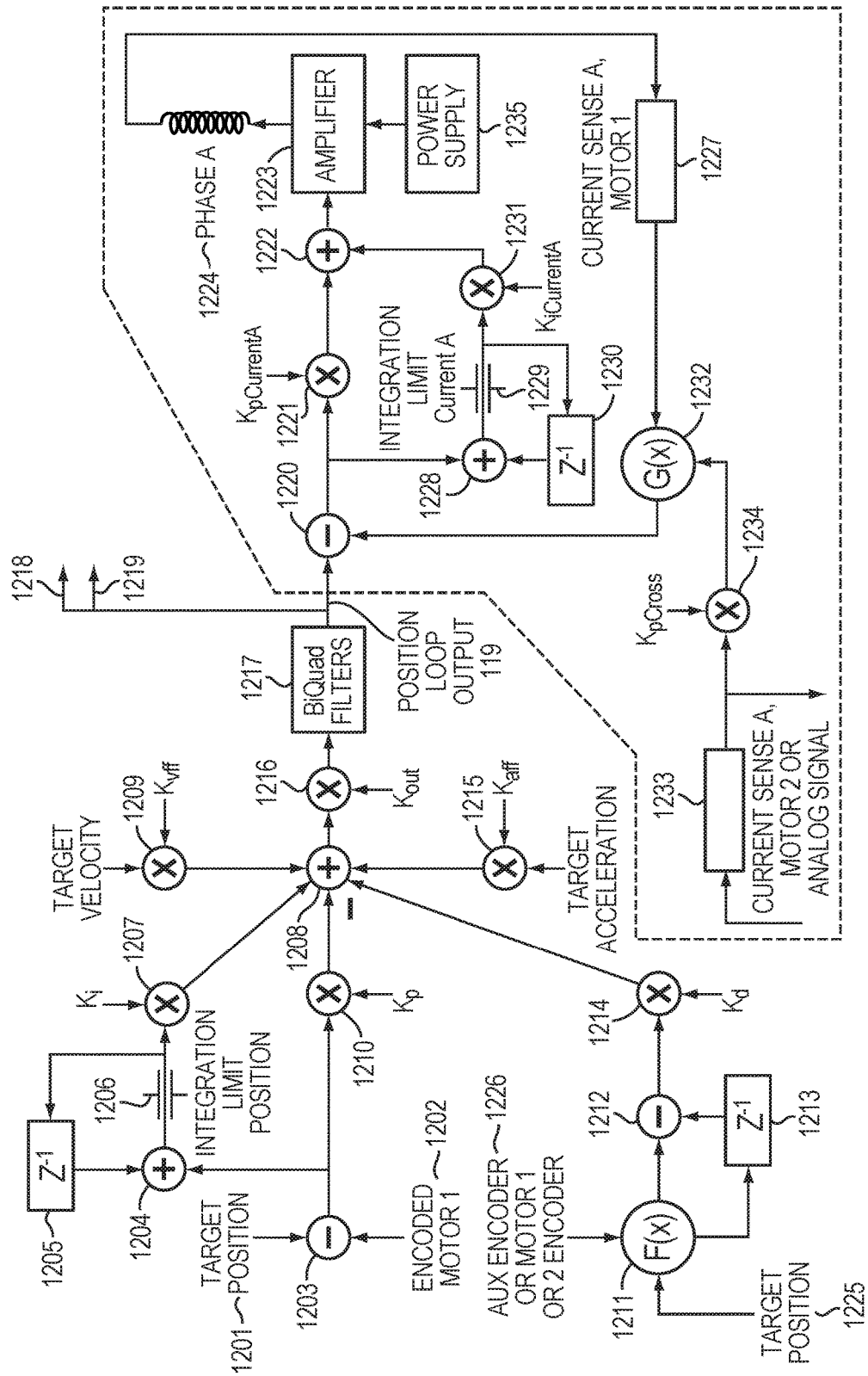
FIG. 12 illustrates a motion control functional diagram and indicates how the motion control system and operator input systems can be functionally coupled to deliver a haptic response to an operator.

FIG. 12 illustrates a functional diagram of the motion subsystem 106 and 108 of FIG. 1 and FIG. 2. A target position 1201 is received from for example the sub-host as shown in FIG. 1 and FIG. 2, but can also be received from a sensor directly as will be shown in FIG. 13. The target position 1201 is compared to an actual position 1202 indicated by an encoder (such as Encoder 112 in FIG. 1 or 2). The target position 1201 and actual position 1202 are compared and subtracted in node 1203 and the resulting difference is sent to an integration loop consisting of an integrator 1205, a summation operator 1204, an integration limiter 1206 and an integration multiplier $K_i$ 1207 and simultaneously is also sent to a proportional multiplier $K_p$ 1210 which multiplies the signal by a settable constant $K_p$. The factors $K_p$, $K_i$ and the integration limit can be set by the motion system user. In addition, an auxiliary encoder feedback 1226 is sent to a differentiation subsystem consisting of a differentiator 1213 a subtraction operator 1212 and a multiplier operation $K_d$ 1214, where the signal is multiplied with a factor $K_d$. In addition the differentiation subsystem can also have a customizable signal processing function F(x) 1211 which may also take a target position 1225, which can be the same as target position 1201 as will be shown in FIG. 13.

Furthermore, in advanced systems, a target velocity can be defined and a velocity feedforward factor $K_{vff}$ can multiplied in operation 1209, and well as a target acceleration 1215 which when multiplied with a $K_{aff}$ (the acceleration feed forward factor) and the result of all signals are added together in operation 1208, and the final result is multiplied by an output factor $K_{out}$ in operation 1216 and sent to a set of filters 1217 (e.g., a BiQuad set of signal filters), resulting in a position loop output 119 as indicated in the figure. The preceding description is essentially the logic that is contained in the position loop controller 106 in FIG. 1 and FIG. 2.

The output of the position loop control 119 may then be sent to three parallel (for a three phase motor) current loop controls 1218, 1219 (who's details are not shown) and 1220 (Which is the current loop control for a single phase motor. Two and Three phase motors would have a similar current loop connected at 1218 and 1219). For a single phase motor the current loop control is shown and consists of a subtraction operation 1220 which outputs the difference between the desired current (essentially the output 119) and the actual current in the motor winding 1224 as measured by current sense resistor 1227. The difference operator 1220 output is sent to an integrator 1230 (consisting of an integration current limiter 1229, summation operator 1228 and multiplier 1231 which takes an $K_{iCurrentA}$ as input) and a proportional multiplier 1221 which takes an input $K_{pCurrentA}$). The output of the integrator 1230 and proportional multiplier 1221 are added together in summation operator 1222 and the result is sent to an amplifier 1223 which receives power from power supply 1235.

An optional circuit consists of current sense 1233, which may be comparable to the current sense block 1106 in FIG. 11A and FIG. 11B. The current from the other motor system is multiplied by a proportionality multiplier 1234 $K_{pCross}$ and the result is processed in customizable function 1232 G(x) and added to the current sense 1227 from motor 1 phase A. The programmable function G(x) 1232 is a user defined function that processes the incoming signals from the two current sense resistors 1227 and 1233 in such a way as to provide a desired input to the current loop circuit. In this way the current (which represents motor torque) can be processed and sent to control a motor as will be shown in FIG. 14.

Figure 13:
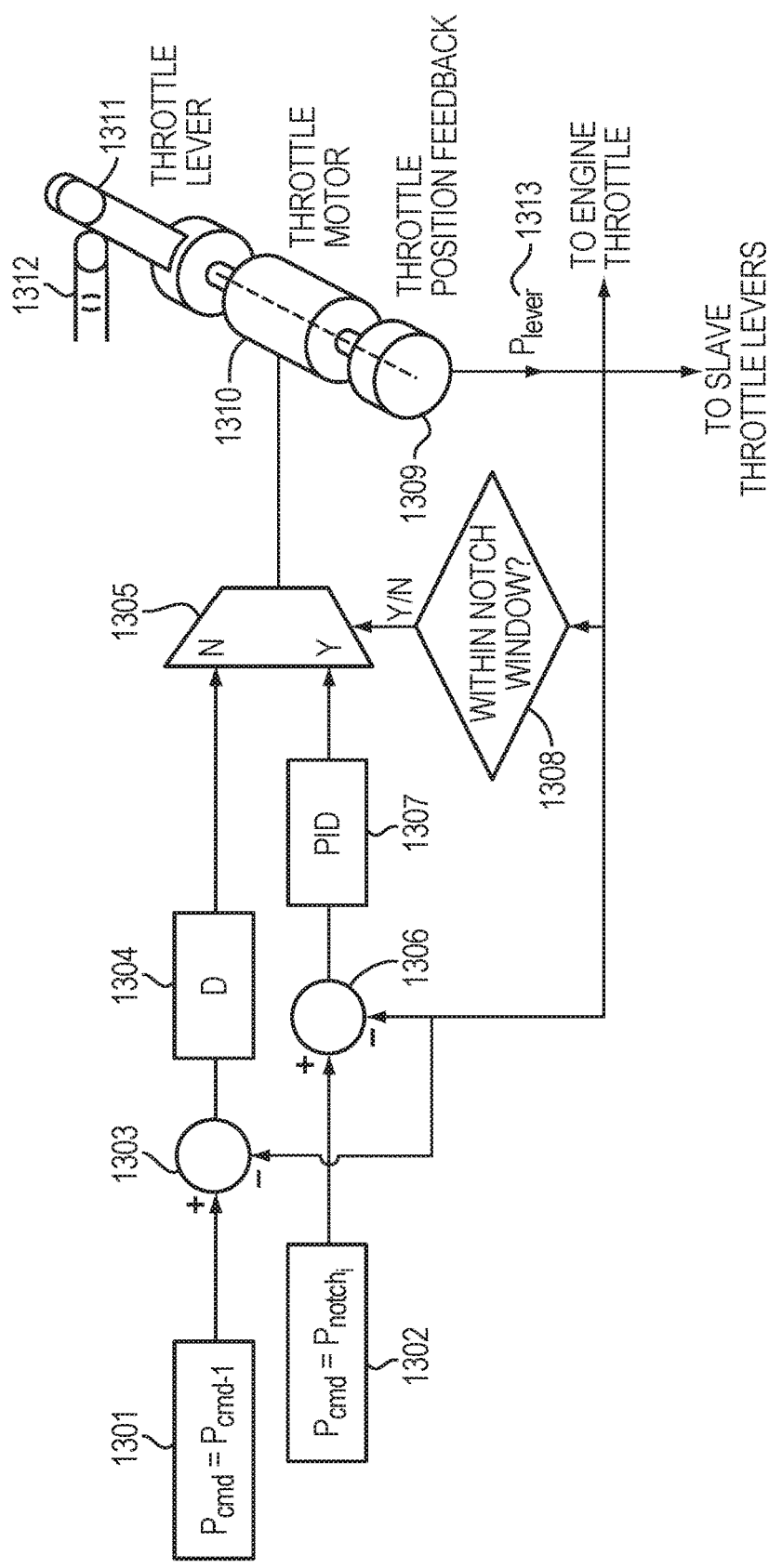
FIG. 13 illustrates a haptic system in a further embodiment, configured for control of an engine lever simulating a virtual detent in a position wherein a reference position is used to determine the feedback mode.

FIG. 13 illustrates an implementation of a coupled haptic system based on a position signal (using F(x) in FIG. 12) for a multi-throttle engine control system, such as is used, by way of example, on large vessels. In such an application, multiple throttle stations are used to control a single engine. Each station can simulate the feel of a detent (usually a ball pressed by a spring into a notch). The configuration of one such throttle station is shown in the figure. A human hand 1312 pushes against a master throttle lever 1311. The lever 1311 turns a motor 1310, which has a position encoder 1309 connected to it. The encoder 1309 sends its position signal 1313 to a number of places: a number of slave throttle controllers (not shown) so that they may assume the same physical position as the master throttle lever 1311, the main engine throttle which changes the engine speed, and to a control circuit consisting of a first set commanded positions $P_{cmd}=P_{cmd-1}$ 1301, a second set of commanded positions 1302 $P_{cmd}=P_{notch_i}$ which represents the desired positions where a notch is meant to be felt, a set of comparators 1303 and 1306 and a set of PID loops as described in FIGS. 12, 1304 and 1307, wherein loop 1304 consists of primarily the differentiation function ($K_p$ and $K_i$ are set to zero in FIG. 12) and wherein loop 1307 has non-zero parameters for $K_p$ and $K_i$. The lever position $P_{lever}$ 1313 is also sent to a compare logic function 1308 which looks at whether the lever is inside a predefined notch window. If the position is within the notch window the compare function allows PID function 1307 to determine the signal output through switcher 1305. If however the lever is not within the notch window, the compare function 1308 switches to the PID function 1304. By setting different PID parameters for the loops 1304 and 1307 the motor resistance can feel very different which creates in turn the feeling that the lever has hit a notch.

Figure 14:
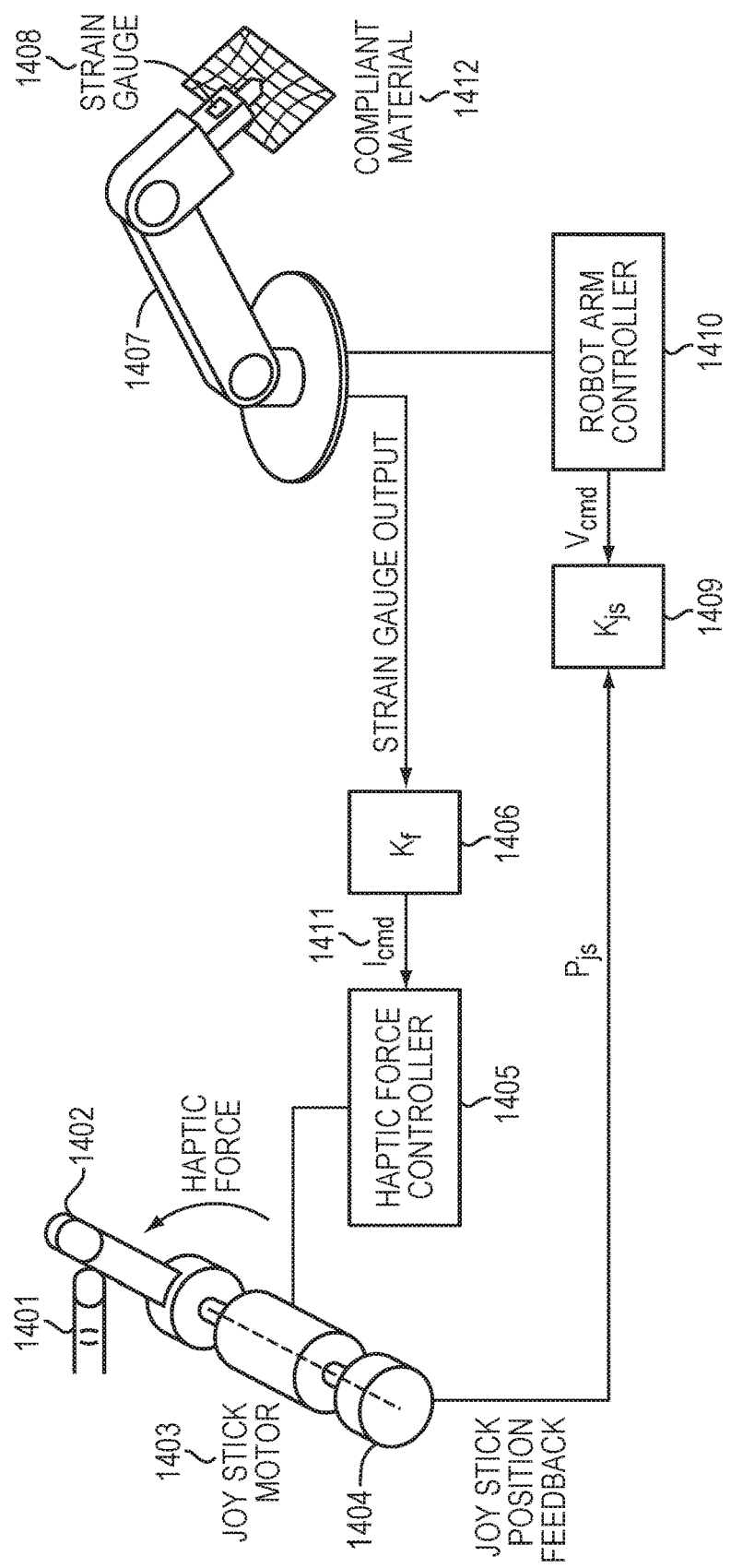
FIG. 14 illustrates a haptic system in a further embodiment, wherein a strain gauge signal is fed back to a joy stick motor wherein a current input is used to determine the feedback to the joystick.

FIG. 14 illustrates a haptic system 1400 in a further embodiment using the G(x) function in FIG. 12. A human hand 1401 pushes against a joystick lever 1402, which is connected to a joy stick motor 1403. The joy stick motor 1403 is in turn outfitted with a position encoder feedback system 1404. The position $P_{js}$ of the joystick lever 1402 is sent to a converted $K_{js}$ 1409 which outputs a velocity command $V_{cmd}$ to a robot arm controller 1410. The robot arm controller 1410 moves the robot arm 1407 which in turn pushes against a compliant material 1412 which results in a signal being generated by a strain gauge 1408 incorporated in the robotic arm 1407. The signal from the strain gauge 1408 is amplified by converter 1406 resulting in a current command 1411 $I_{cmd}$ to the haptic feedback controller 1405. This haptic controller in turn imparts a current through the motor 1403 resulting in the operator feeling a vibration or counterforce.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions. Accordingly, the foregoing description and attached drawings are by way of example only, and are not intended to be limiting.

While example embodiments have been particularly shown and described, it will be understood by those skilled in the art that various changes in form and details may be made therein without departing from the scope of the embodiments encompassed by the appended claims.

What is claimed is:

1. A motor control module, comprising:
an amplifier subsystem configured to drive a motor and output motor data indicating status of the motor;
a profile generation subsystem configured to issue motor control commands to the amplifier subsystem, the profile generation subsystem further configured to 1) generate motor summary data based on the motor data, and 2) selectively output an error signal based on at least one of the motor data and motor summary data; and
a local sub-host configured to generate module summary data based on the motor summary data, the error signal and profile generation subsystem status data, the local sub-host further configured to forward the module summary data to a motor control host.

2. The module of claim 1, wherein the amplifier subsystem is further configured to generate the motor data based on at least one measured value of the motor.

3. The module of claim 2, wherein the motor data, motor summary data and measured value include at least one of motor temperature, motor winding temperature, average temperature, deviation of temperature and temperature drift.

4. The module of claim 2, wherein the motor data, motor summary data and measured value include at least one of motor current, average current, deviation of current and current drift.

5. The module of claim 2, wherein the motor data, motor summary data and measured value include at least one of motor position, position error, cumulative position error, motor velocity, velocity error, cumulative velocity error, motor acceleration, acceleration error, cumulative acceleration error, an amplifier component temperature, motor torque, motor jerk, a resonant frequency of the motor, and motor motion completion time.

6. The module of claim 1, wherein the motor data includes temperature data of the motor.

7. The module of claim 1, wherein the amplifier subsystem includes a current sensor configured to measure a current at the motor and output current data to the profile generation subsystem.

8. The module of claim 7, wherein the motor summary data includes at least one of average current, deviation of current and current drift based on the current data.

9. The module of claim 1, wherein the motor data includes indications of temperature and current of the motor, the profile generation subsystem further configured to 1) determine whether the temperature and current exhibit a drift, and 2) selectively output the error signal to indicate the drift.

10. The module of claim 1, wherein the profile generation subsystem includes a current loop unit, a position loop unit, and a profile generator.

11. The module of claim 10, wherein the current loop unit is further configured to generate current summary data based on measured current at the motor, the motor summary data including the current summary data.

12. The module of claim 10, wherein the position loop unit is further configured to generate position summary data based on measured positions of the motor, the motor summary data including the current summary data.

13. A method of operating a motor control module, comprising:
at an amplifier subsystem:
driving a motor; and
outputting motor data indicating status of the motor; and
at a profile generation subsystem:
issuing motor control commands to the amplifier subsystem;
generating motor summary data based on the motor data; and
selectively outputting an error signal based on at least one of the motor data and motor summary data;
generating module summary data based on the motor summary data, the error signal and profile generation subsystem status data; and
forwarding the module summary data to a motor control host.

14. A method of operating a motor control module, comprising:
　at an amplifier subsystem:
　　driving a motor;
　　generating motor data indicating status of the motor; and
　　generating motor summary data based on the motor data; and
　at a profile generation subsystem:
　　issuing motor control commands to the amplifier subsystem;
　　receiving at least one of the motor data and motor summary data from the amplifier subsystem; and
　　selectively outputting an error signal based on at least one of the motor data and motor summary data;
　generating module summary data based on the motor summary data, the error signal and profile generation subsystem status data; and
　forwarding the module summary data to a motor control host.

15. A method of operating a motor control module, comprising:
　receiving first motor data indicating status of a motor;
　calculating, at an amplifier subsystem, motor summary data based on the motor data;
　determining, at a profile generation subsystem, whether the motor data exhibits a drift based on the motor summary data; and
　selectively outputting an error signal based on the drift.

16. A motion system, comprising:
　a first motor control module including a first position loop configured to receive position encoder data from a first motor and a second motor, the first motor control module configured to control the first motor based on the position encoder data from the first and second motors; and
　a second motor control module including a second position loop configured to receive the position encoder data from the first and second motors, the second motor control module configured to control the second motor based on the position encoder data from the first and second motors.

17. The system of claim 16, wherein the second motor is integral to a manual controller, the second motor being configured to 1) generate haptic feedback to a user, and 2) generate the position encoder data of the second motor as a function of a manual input by the user.

18. The system of claim 16, further comprising:
　a sub-host configured to generate motor control commands to the first and second motor control modules; and
　a transform module configured to inverse transform a measured torque of at least one of the first and second motors and forward a transformed measured torque to the sub-host.

19. The system of claim 18, further comprising:
　a first motor subsystem including the first motor control module and a third motor control module configured to control a third motor based on the position encoder data from at least one of the first and second motors; and
　a second motor subsystem including the second motor control module.

20. The system of claim 19, wherein the second motor subsystem further includes a fourth motor control module configured to control a fourth motor based on the position encoder data from at least one of the first and second motors.

21. A method of operating a motor control module, comprising:
　at a first processing block in a processing chain:
　　receiving first motor data indicating status of a motor;
　　calculating at least one of a mean and a standard deviation of the first motor data;
　　storing the first calculated data as a first stored value;
　　waiting a set period of time;
　　receiving second motor data indicating status of a motor;
　　calculating at least one of a mean and a standard deviation of the second motor data;
　　storing the second calculated data as a second stored value;
　　determining if a drift from the first stored value has occurred; and
　　outputting first summary data, the first summary data indicating at least one of the mean and a drift from a stored status value; and
　at a second processing block in the processing chain:
　　receiving the first summary data indicating drift of a motor; and
　　determining an error action based on the drift of a motor.

* * * * *